US010993503B2

(12) United States Patent
Truitt et al.

(10) Patent No.: US 10,993,503 B2
(45) Date of Patent: May 4, 2021

(54) RECONFIGURABLE APPAREL MANUFACTURE AND BUSINESS PROCESS

(71) Applicant: CODE FOOTWEAR, LLC, Medina, WA (US)

(72) Inventors: Nicole Justis Truitt, San Diego, CA (US); Benjamin David Sullivan, San Diego, CA (US); Zeyad Moussa, San Diego, CA (US); Daniel Kincade, Encinitas, CA (US)

( * ) Notice: Subject to any disclaimer, the term of this patent is extended or adjusted under 35 U.S.C. 154(b) by 373 days.

(21) Appl. No.: 15/594,657

(22) Filed: May 15, 2017

(65) Prior Publication Data

US 2017/0245594 A1    Aug. 31, 2017

Related U.S. Application Data

(62) Division of application No. 13/984,644, filed as application No. PCT/US2012/024753 on Feb. 10, 2012, now Pat. No. 9,675,135.

(Continued)

(51) Int. Cl.
*A43B 23/02* (2006.01)
*B81C 1/00* (2006.01)
(Continued)

(52) U.S. Cl.
CPC ............ *A43B 23/026* (2013.01); *A41D 27/00* (2013.01); *A41D 27/08* (2013.01); *A43B 1/0027* (2013.01);
(Continued)

(58) Field of Classification Search
CPC ......... B29C 65/00; B29C 65/02; B29C 65/18; B29C 65/48; B29C 65/481; B29C 65/4815; B29C 66/00; B29C 66/01; B29C 66/301; B29C 66/05; B29C 66/20; B29C 66/24; B29C 66/244; B29C 66/40; B29C 66/41; B29C 66/43; B29C 66/438; B29C 66/70; B29C 66/71; B29C 66/712; B29C 66/73152; B29C 66/7392; B29C 66/742; B29C 65/40; B29C 65/41; B29C 65/43;
(Continued)

(56) References Cited

U.S. PATENT DOCUMENTS 5,117,566 A * 6/1992 Lloyd ................. A43B 13/206
                                                                36/28
5,131,174 A * 7/1992 Drew .................... A43B 21/28
                                                                36/29
(Continued)

FOREIGN PATENT DOCUMENTS

WO     WO-8910074 A1 * 11/1989    ........... A43B 13/206
WO     WO-9110376 A1 *  7/1991    ........... A43B 13/189
WO     WO-02098256 A1 * 12/2002   ............. A43B 23/24

OTHER PUBLICATIONS

SABIC Innovative Plastics, "LEXAN® THERMOPANEL® sheet," 2009. https://sfs.sabic.eu/wp-content/uploads/2012/05/lexan-thermopanel-sheet.pdf (Year: 2009).*

(Continued)

*Primary Examiner* — Philip C Tucker
*Assistant Examiner* — Brian R Slawski

(57) ABSTRACT

Provided herein are methods for the modulation of appearance or material properties within items of apparel or equipment. Also provided herein are design articles having alterable designs.

20 Claims, 24 Drawing Sheets

Related U.S. Application Data

(60) Provisional application No. 61/443,667, filed on Feb. 16, 2011, provisional application No. 61/442,142, filed on Feb. 11, 2011.

(51) Int. Cl.

| | | |
|---|---|---|
| *A41D 27/08* | (2006.01) | |
| *G02B 5/24* | (2006.01) | |
| *G02B 26/00* | (2006.01) | |
| *G09F 13/24* | (2006.01) | |
| *A43B 1/00* | (2006.01) | |
| *A43B 3/00* | (2006.01) | |
| *A43B 3/24* | (2006.01) | |
| *G09F 21/02* | (2006.01) | |
| *A41D 27/00* | (2006.01) | |
| *A43B 23/24* | (2006.01) | |
| *B44C 5/00* | (2006.01) | |
| *B29C 65/00* | (2006.01) | |
| *B29C 65/18* | (2006.01) | |

(52) U.S. Cl.
 CPC .......... *A43B 3/0005* (2013.01); *A43B 3/0078* (2013.01); *A43B 3/242* (2013.01); *A43B 23/0205* (2013.01); *A43B 23/0215* (2013.01); *A43B 23/0245* (2013.01); *A43B 23/24* (2013.01); *B44C 5/00* (2013.01); *B81C 1/00119* (2013.01); *G02B 5/24* (2013.01); *G02B 26/004* (2013.01); *G09F 13/24* (2013.01); *G09F 21/02* (2013.01); *B29C 65/18* (2013.01); *B29C 66/244* (2013.01); *B29C 66/438* (2013.01); *B29C 66/712* (2013.01); *B29C 66/7392* (2013.01); *B29C 66/73152* (2013.01); *B29C 66/742* (2013.01); *Y10T 137/87169* (2015.04); *Y10T 156/10* (2015.01)

(58) Field of Classification Search
 CPC ....... B29C 65/438; B29C 65/70; B29C 65/71; B29C 65/712; B29C 65/73152; B29C 65/7392; B29C 65/742; A43B 1/0027; A43B 1/0072; A43B 3/0078; A43B 3/24; A43B 3/242; A43B 13/189; A43B 23/24; A43B 23/026; A43B 23/0215; A43B 23/0205; A43B 23/0245; A43B 3/0005; A41D 27/08; A41D 27/00; B44C 5/00; B81C 1/00119; G09F 21/02; G09F 13/24; G02B 5/24; G02B 26/004; Y10T 137/87169; Y10T 156/10
 USPC .......... 156/60, 145, 146, 153, 155, 156, 196, 156/210, 242, 245, 246, 285, 287, 289, 156/290, 291, 292, 293, 308.2, 308.4, 156/309.6; 36/28, 29, 153, 35 R, 35 B, 36/100, 103, 136, 137, 45; 428/35.2, 428/178; 137/154
 See application file for complete search history.

(56) References Cited

U.S. PATENT DOCUMENTS

| | | | | |
|---|---|---|---|---|
| 5,148,614 | A * | 9/1992 | Kelly | A43B 11/00 36/1 |
| 5,502,901 | A * | 4/1996 | Brown | A43B 1/0018 36/27 |
| 5,673,500 | A * | 10/1997 | Huang | A43B 3/0078 177/245 |
| 5,771,606 | A * | 6/1998 | Litchfield | A43B 13/203 36/28 |
| 6,014,823 | A * | 1/2000 | Lakic | A41D 19/01523 36/11.5 |
| 6,747,777 | B1 * | 6/2004 | Sikora | G09F 19/12 359/253 |
| 2002/0127736 | A1 * | 9/2002 | Chou | F04B 11/00 436/180 |
| 2002/0173033 | A1 * | 11/2002 | Hammerick | C12M 3/00 435/305.2 |
| 2005/0255003 | A1 * | 11/2005 | Summersgill | B01F 5/0646 422/606 |
| 2006/0065529 | A1 * | 3/2006 | Schlenoff | G01N 27/44752 204/450 |
| 2007/0003448 | A1 * | 1/2007 | Kanigan | B01L 3/0244 422/400 |
| 2008/0141433 | A1 * | 6/2008 | Rhodes-Vivour | A42B 1/004 2/69 |
| 2010/0084032 | A1 * | 4/2010 | Xie | F15C 5/00 137/825 |
| 2010/0112723 | A1 * | 5/2010 | Battrell | B01L 3/50273 436/501 |
| 2011/0135546 | A1 * | 6/2011 | Kurowski | B29C 65/18 422/502 |
| 2011/0192053 | A1 * | 8/2011 | Beers | A43B 13/20 36/103 |
| 2012/0084999 | A1 * | 4/2012 | Davis | A43B 23/029 36/93 |
| 2012/0122731 | A1 * | 5/2012 | Soh | B03C 1/286 506/12 |

OTHER PUBLICATIONS

Pawar, Eshwar, "A review article on acrylic PMMA," Apr. 2016, IOSR Journal of Mechanical and Civil Engineering. https://pdfs.semanticscholar.org/ad61/219b6ba55928f602f2512027f15f7f8eba20.pdf (Year: 2016).*

* cited by examiner 2001  2002  2003

1. Stamp, (or die cut, cold form, ablate, melt, etc.) pattern into channel material to create circuit walls 2. Laminate to seal channels 3. Butt couple & adhere connector 4. Overmold entire piece in urethane or other transparent polymer. Provides double seal & texture.

5. Attach to backing if desired

6. Change color

RECONFIGURABLE APPAREL MANUFACTURE AND BUSINESS PROCESS

CROSS REFERENCE

This application claims the benefit of U.S. Provisional Application Nos. 61/442,142, filed 11 Feb. 2011, and 61/443,667, 16 Feb. 2011, both of which are incorporated herein by reference in their entireties.

FIELD OF THE INVENTION

Provided herein are methods of manufacturing and marketing items that contain embedded microfluidic channel networks in order to modulate the appearance or material properties within said items of apparel or equipment. In particular, the present invention relates to manufacturing and marketing methods thereof, including (1) methods of construction and use of the microfluidic channel network (e.g., specialized methods suitable for the apparel and design articles described herein), (2) methods of construction and use of a manually actuated docking station, (3) the distribution of content codes (e.g., through downloadable configuration files, podcasts, celebrity podcasts, social crowdsourcing, propagation through social networks or the like).

BACKGROUND OF THE INVENTION

There has always been the desire to express oneself through color. The ability to modulate the appearance or material properties of apparel, equipment or other items had previously required discrete components, for instance distinct pairs of shoes to coordinate with different outfits, different belts, or different color vehicles. Further, apparel, sporting equipment and other items are often provided for consumption in a manner illustrating one or more design feature. Generally, such design features are immutable. Consumers wishing to have a different design feature on an article that they already own are generally forced to purchase a second version of the article. The purchase of two or more versions of an identical article to simply provide a new design is extremely inefficient. Provided herein are articles and methods whereby such inefficiencies are overcome.

SUMMARY OF THE INVENTION

Provided herein are articles having one or more design element that is capable of being modified. In some instances, an article or design element provided herein comprises a fluidic circuit. Generally, such fluidic circuit has at least one opening (e.g., inlet and/or outlet) through which fluid may transgress (e.g., ingress through an inlet and egress through an outlet). In specific instances, such fluidic circuits are liquid circuits. In further or alternative embodiments, such fluidic circuits are microfluidic circuits.

In items such as apparel (e.g., footwear, shoes, belts, backpacks, hats, bracelets, wristbands, shirts, scarves, jewelry, glasses, materials for apparel, release papers, fibers, etc.), equipment (e.g., skateboards, rollerblades, snowboards, gloves, pads, appliances, computers, electronics, gadgets, toys, etc.), and other three-dimensional objects (signs, corporate art, corporate logos, military vehicles, military gear, military installations, helmets, vehicle body panels, housewares, furniture, tabletops, walls, paintings, etc.), embodiments of the present invention provide for incorporation of one or a plurality of microfluidic circuits within the item to allow for the modulation of color or other material properties of the item. In specific embodiments, this modulation can be readily achieved by the user of the item.

In one embodiment, a microfluidic circuit provided for herein wraps around a substructure (e.g., a design element) of the item. In some instances, inlets to, and outlets from a microfluidic circuit provided herein are co-located within a port portion of the item. In certain embodiments, the inlets and outlets carry valves, caps, or other seals to mitigate evaporation or backflow. In some instances, a port facilitates connection of the microfluidic circuit to a docking station. In some embodiments, a useful port provides for a well-sealed interface between the microfluidic circuit and a docking station (e.g., between inlet and/or outlet of the microfluidic circuit and a connector emanating from a docking station). In specific embodiments, the connector is the male complement to a female port. In certain embodiments the docking station comprises a pump, a mixer, valves, one or more color cartridge(s), a connector, a waste compartment, a computer controlled interface, a combination thereof, or all of the above. In certain embodiments, a user may select a color or a combination of colors that are mixed within the docking station and dispensed through the microfluidic circuit of the item. In other embodiments, the docking station is comprised of pressurized cartridges that dispense and collect fluid when connected to the item. In certain embodiments, the docking station is comprised of a manually actuated cartridge, which upon actuation, creates positive or negative pressure within the microfluidic circuit to move fluid throughout the article. In one embodiment, the cartridge contains two chambers; a vacuum chamber and a fluid filled chamber, and upon actuation some or all of the old fluid from the article flows into the vacuum chamber while being displaced by fluid emanating from the cartridge fluid chamber. In yet another embodiment, the cartridge contains one or more syringe plungers to allow the user to actuate either positive or negative pressure in order to produce fluid flow within the microfluidic circuit.

BRIEF DESCRIPTION OF THE DRAWINGS

FIG. 1 shows shoe 1001 with two microfluidic circuits 1002 and 1003. FIG. 1A shows the shoe without color within the microfluidic circuit. FIG. 1B demonstrates the results if the first circuit 1002 has been filled with a dark color and circuit 1003 filled with a light color. FIG. 1C shows circuit 1002 filled with a dark color and circuit 1003 filled with a medium luminosity color.

DETAILED DESCRIPTION OF THE INVENTION

Methods of Construction and Use of a Microfluidic Channel Network

Provided in certain embodiments herein are design articles (such as any article described herein) comprising one or more microfluidic channel network in or on (e.g., on the surface of) the design article. In some instances, in order to create large-format microfluidics (e.g., suitable for providing large format design on a design article), one or more microfluidic channel networks is woven through (e.g., through or over the surface of) the item of interest. In one embodiment, large-format microfluidics are accomplished by weaving a small outer diameter tube into a pattern, encasing the patterned tube within an exterior matrix such as a transparent polymer of similar refractive index, and exposing the two ends of the tube outside the matrix for fluidic connection. In another embodiment, multiple tubes are encompassed or woven into or atop the matrix. In some instances, the multiplicity of input ends and of output ends of the tubes are aggregated into domains for fluidic connection. In some instances, such as in some embodiments of apparel or shoes, the microfluidic circuit material is on the order of one to two square feet in size. In other embodiments, however, any suitable sized material is optionally utilized. Provided in certain embodiments herein is a process to seal the dozens to thousands of serpentine wall joints that are useful in creating such a network. In some embodiments, provided herein, are high throughput processes that provide rapid and inexpensive manufacturing of such an article.

Figure 18:
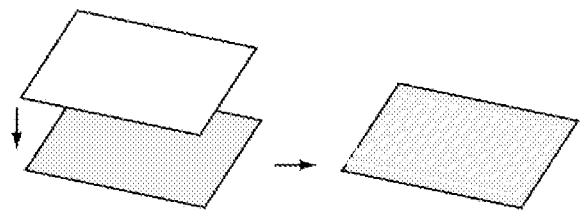
FIG. 18 is an example of a lamination process to create a microfluidic channel network with an integrated connector.
Figure 18:
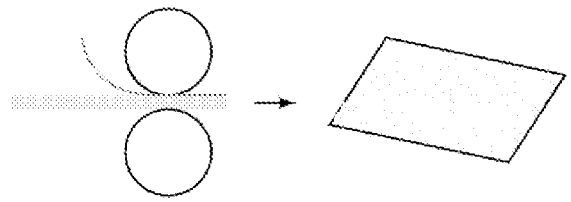
Figure 18:
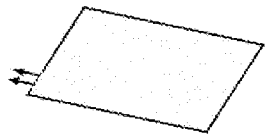
Figure 18:
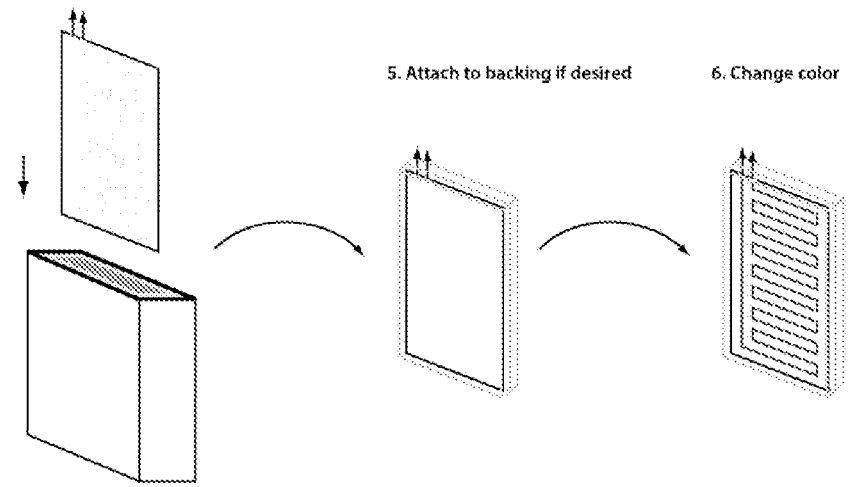

In one embodiment, a first (e.g., lower—or distal from the article surface) material, such as a thermoplastic (e.g., urethane, polyester, etc.), is molded into a serpentine channel network. In some embodiments, the first material (e.g., thermoplastic) is polymerized (at least partially polymerized). In some instances, a second (e.g., upper) material, such as a second thermoplastic, is laminated onto the first material (e.g., applying evenly distributed pressure and heat). In some embodiments, bonding of the composite layers is promoted by means of physical and/or chemical adhesion due to thermal exposure, pressure, adhesives, solvents, surface chemistry activation, polymerization, or a combination thereof. In certain embodiments, the lower thermoplastic is of a harder or softer durometer than the top sealing thermoplastic. In various embodiments, the first and second thermoplastics have any suitable durometer for achieving a desired product. For instance, in some embodiments, the first (e.g., lower) channel material has a 20-30 A durometer with the walls embedded within, while the second material (e.g., upper sealing layer) provides exterior protection with a 25-40 A durometer hardness. In another embodiment, the lower channel material has a harder 25-70 A hardness (e.g., to provide mechanical stability to the walls) while the second material (e.g., top sealing layer) is laminated onto the walls using a 15-30 A durometer material. In yet another embodiment, the first and second (e.g., upper and lower) materials comprise similar or identical materials and/or have similar or identical durometer. In some embodiments, lamination is optionally assisted through the use of roller(s), e.g., machined roller(s) that apply more heat and pressure to the channel walls than to the channel. For instance, FIG. 18 illustrates one embodiment whereby a roller wheel applies heat and pressure selectively to areas of the thermoplastic sandwich to create sealed channel walls. In this embodiment, the connector is first adhered to the circuit inlet and outlet before the entire piece is coated in a transparent encapsulating polymer overmold. In one embodiment, the optional overmold imparts additional sealing and texture as necessary. In one embodiment, microfluidic material is also attached to a backing material to provide mechanical robustness, e.g., to withstand the strain encountered during wear in a shoe. In another embodiment, the backing would be a reflective material, such as a mylar, to impart desired optical properties to the composite. Other possibilities include the use of thermoformed or cold formed foils or foil composites as the patterned channel material and a polyester/polyvinyl chloride, polychlorotrifluoro ethylene, or cyclic olefin copolymer backing.

In other embodiments, microfluidic channel networks are ultrasonically or RF welded into the thermoplastic sandwich. The upper or lower parts may be previously molded to focus energy to the channel walls. For ultrasonic welding, the preferred frequencies are 10-80 kHz. In the case where a single ultrasonic horn is insufficient to cover the entire desired apparel area, multiple horns can be used. Provided herein are designs that leave a stitching area of 0.5 mm to 5 mm between overlapping horn designs, or any other spacing, e.g., so to allow subsequent precision welding to stitch across the large horn deficiencies. In yet other embodiments, thermoplastic sandwiches are swelled using an ionic bath before electrowelding via current passing between the walls of the upper and lower parts.

Figure 19:
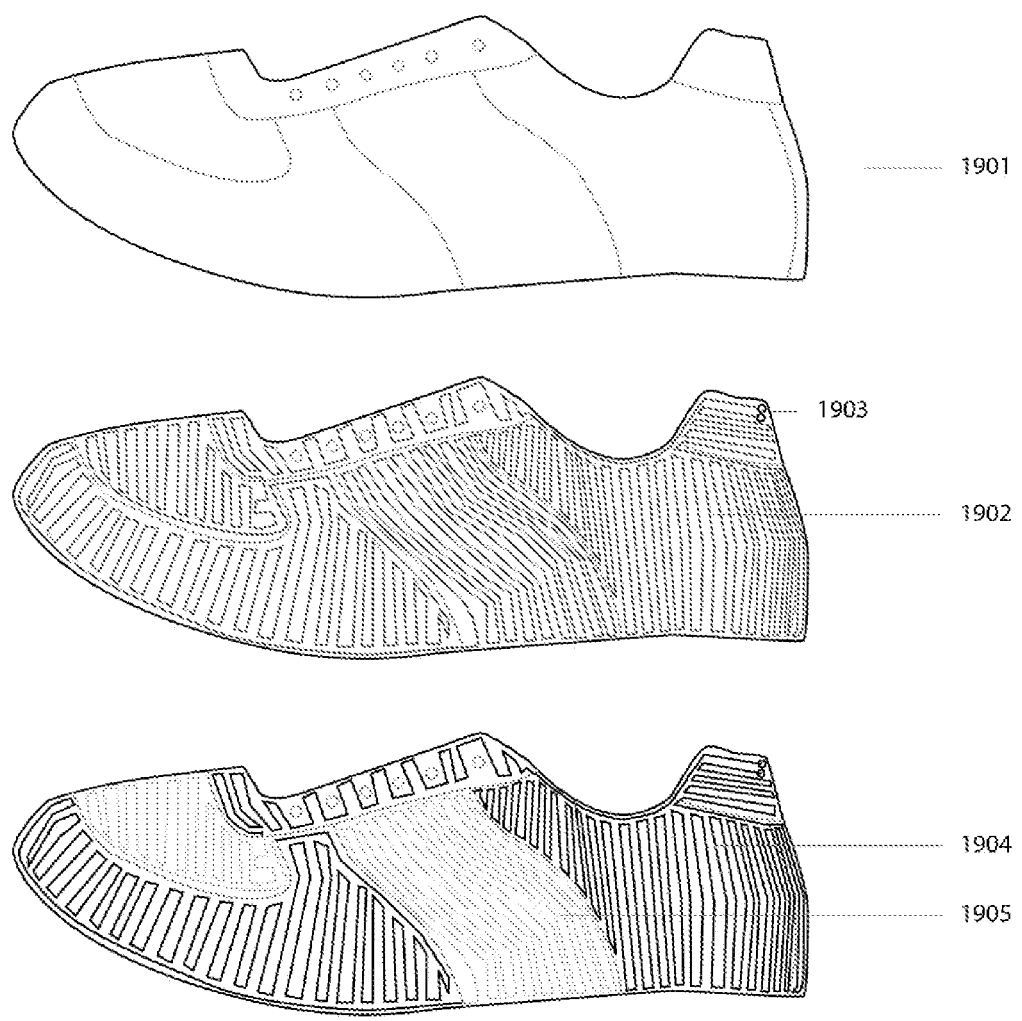
FIG. 19 is an example of virtual panels within a single item. A traditional shoe upper 1901 may contain a series of different panels delineated by stitching patterns. In this embodiment, a single microfluidic circuit 1902 weaves its way through the shoe upper, beginning and terminating in a single inlet/outlet pair 1903. Microfluidic circuit 1902 features varying densities and patterns of the circuit to produce an illusion that multiple panels exist when only a single continuous channel exists. When different colors are sequentially pulled through the circuit, for instance a darker color 1904 and a lighter color 1905, the colors reinforce the optical illusion that different virtual panels exist.

Provided in certain embodiments herein is a design article or design element comprising a microfluidic circuit channel comprising at least one color, angle, density, or the like. In specific embodiments, the design article or design element comprises a single microfluidic channel. In certain embodiments, a single microfluidic channel connecting inlets and outlets is fashioned into multiple virtual panels by alternating the direction and/or density of the filling pattern used. In some embodiments, using a single channel allows for a much wider range of filling pressures without generation of voids. In some instances, if multiple channels are filled in parallel, there is a good chance that high pressure paths will be excluded and fluid will preferentially flow through low pressure paths—much like an electrical short will carry current around an electrical circuit. The current design for filling a large area with a single channel to create multiple channels eliminates this problem. Per example shown in FIG. 19, a single microfluidic circuit with one inlet and one outlet, with various angles and densities of fill create the illusion of separate panels when filled with one or more colors.

Provided in certain embodiments herein is a design article or design element comprising a microfluidic circuit in three-dimensions. In some embodiments, a three-dimensional microfluidic circuit overlays serpentine channel arrays at varying depths of the article to create intricate visual effects (e.g., texture, patterns, color fields, etc.) as seen from surface of the article. In some embodiments, a three-dimensional microfluidic circuit consists of a single or of multiple layers of channels and is shaped to the three-dimensional form of the article (e.g., shoe, electronics case, etc.). In one embodiment, a three-dimensional microfluidic circuit is accomplished by generating a sealed planar microfluidic circuit in a flexible substrate (e.g., urethane) and affixing this microfluidic circuit conformally to a three-dimensionally formed article. In certain embodiments, the microfluidic circuit is affixed by means of pressure-sensitive adhesive. In some embodiments, bonding between the microfluidic circuit and article is promoted by means of physical and/or chemical adhesion due to thermal exposure (e.g., welding, laminating, etc.), pressure, adhesives, solvents, surface chemistry activation (e.g., UV-ozone exposure), polymerization (e.g., reaction injection molding), mechanical fastening, or a combination thereof. In other embodiments, the three-dimensional microfluidic circuit is formed via additive manufacturing (e.g., selective laser sintering, fused deposition modeling, stereolithography, 3D printing, etc.). In one embodiment, the final sealed microfluidic circuit is formed by laying down successive layers of material with a 3D printer to form the channel walls. Zones that have not been printed upon create the internal channels of the final microfluidic circuit. In other embodiments, the three-dimensional microfluidic circuit is formed via direct subtractive manufacturing (e.g., laser etching, lost-wax casting, investment casting, etc.) in which the microfluidic channels are formed by the removal of material from within the article. In one embodiment, a three-dimensional article is formed in polycarbonate and internal laser etching is used to remove material to create the microfluidic channels.

Methods of Construction and Use of a Manually Actuated Docking Station

Figure 20:
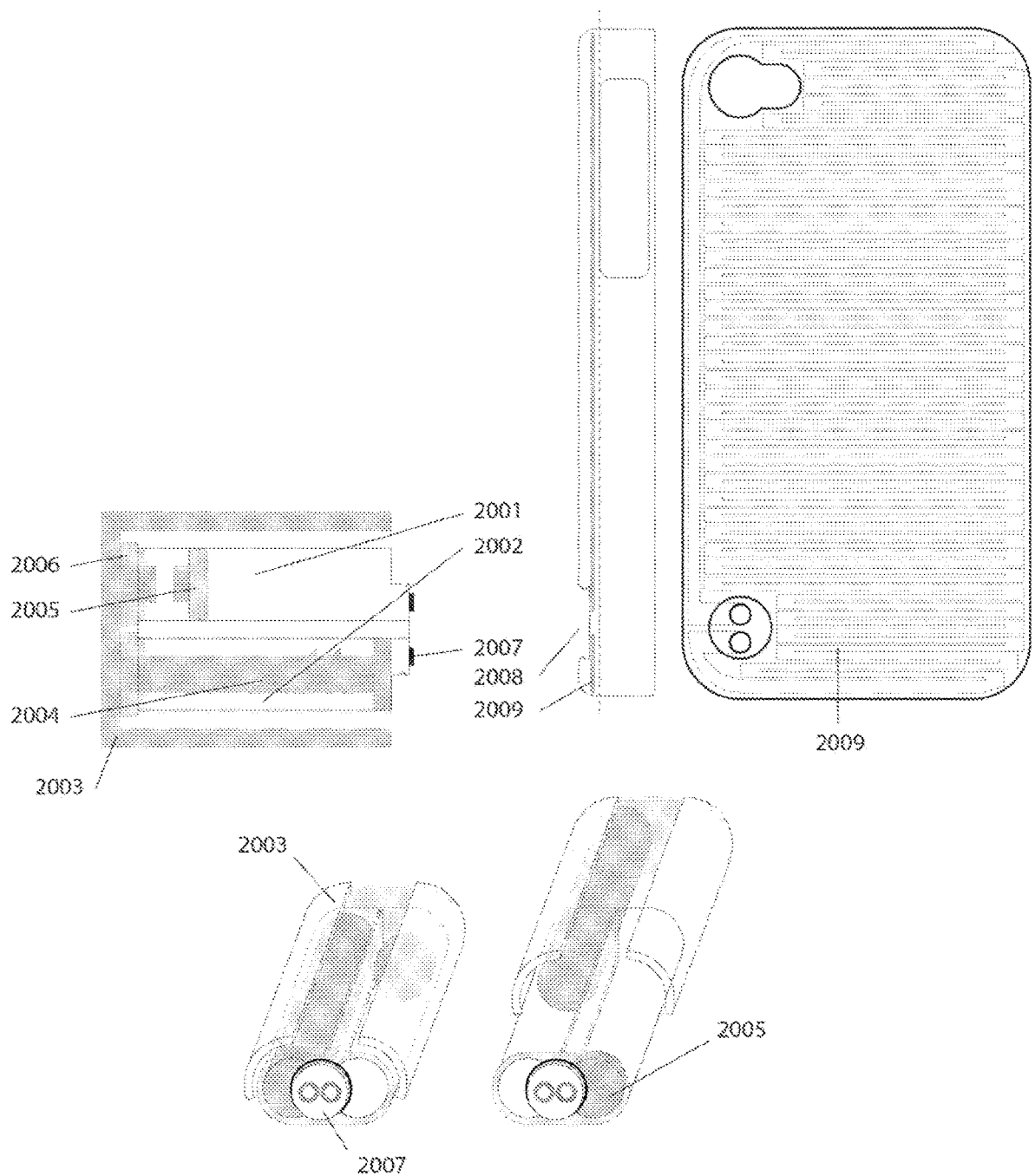
FIG. 20 is an example of a manually actuated docking station with an integrated connector. In this embodiment, the docking station is comprised of a fluid cartridge 2001 and a waste cartridge 2002. The user would pull back on the plunger assembly 2003 to actuate the ratcheted syringe 2004 and a create a vacuum within waste compartment 2002. In one embodiment, an absorbent material, such as hydrogels, is contained in the waste cartridge 2002 to prevent spillage or backflow. As the vacuum is created, the syringe nub 2005 moves to displace the colored fluid. The syringe nub 2005 also serves to keep the fluid sealed from the environment during storage. A benefit of this design is the minimal dead volume in the coupling of male connector 2007 to female connector 2008 that minimizes spillage risks. As the ratcheted syringe 2004 is pulled back, it can be finely tuned for some length until the ratchet teeth move past the ratchet cap 2006, wherein the syringe can no longer be pushed forward. The ratcheting ensures that the cartridge is used only a few times before recycling. The male connector 2007 interfaces with the female connector 2008, shown here embedded within a mobile phone case, with an embedded microfluidic channel network 2009, shown in cross sectional and planar view. In one embodiment, the connector 2007 is further comprised of external O-ring seals to provide for a sound fluidic seal.

Provided in certain embodiments herein is a docking station comprising a pump, color cartridges and connector (collectively, the "cartridge") that connects to the corresponding connector integrated into the microfluidic circuit and allows the user to manually actuate the initiation and duration of flow through the microfluidic circuit. FIG. 20 is an example of a manually actuated docking station with an integrated connector. In some embodiments, the docking station is comprised of a fluid cartridge 2001 and a waste cartridge 2002. The user would pull back on the plunger assembly 2003 to actuate the ratcheted syringe 2004 and create a vacuum within waste compartment 2002. In one embodiment, an absorbent material, such as hydrogels, is contained in the waste cartridge 2002 to prevent spillage or backflow. As the vacuum is created, the syringe nub 2005 moves to displace the colored fluid. The syringe nub 2005 also serves to keep the fluid sealed from the environment during storage. As the ratcheted syringe 2004 is pulled back, it can be finely tuned for some length until the ratchet teeth move past the ratchet cap 2006, wherein the syringe can no longer be pushed forward. The ratcheting ensures that the cartridge is used only a few times before recycling. The male connector 2007 interfaces with the female connector 2008, shown here embedded within a mobile phone case, with an embedded microfluidic channel network 2009, shown in cross sectional and planar view.

Figure 21:
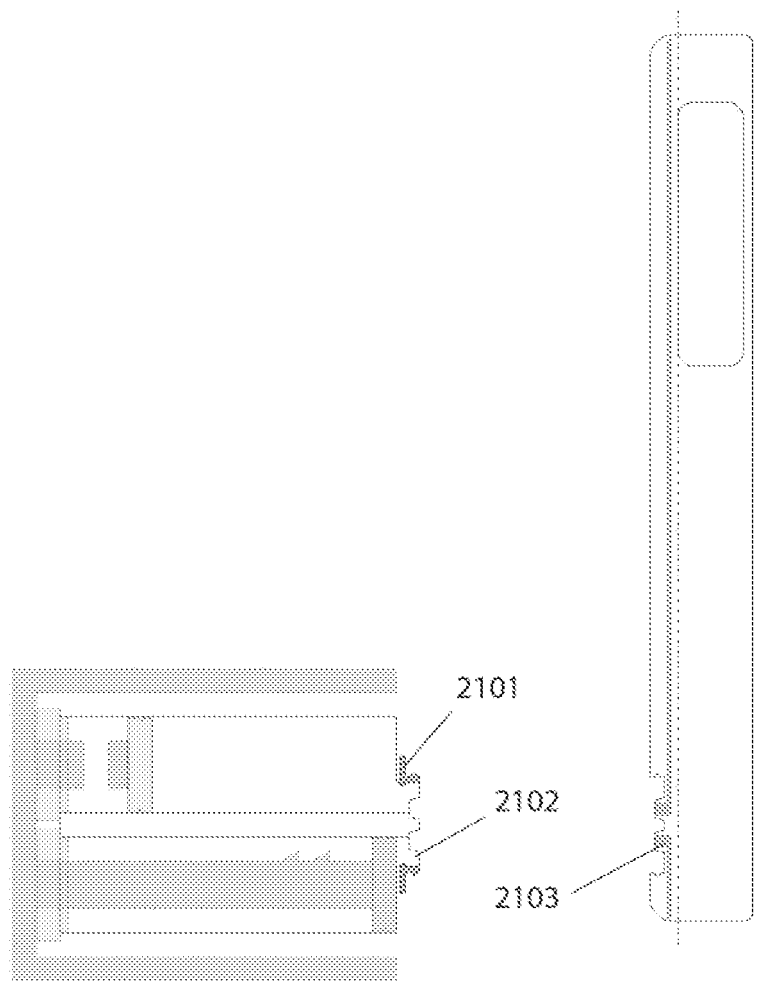
FIG. 21 is another example of a manually actuated docking station with an integrated connector. In this embodiment, the connector is comprised of a freely rotating screw ring 2101 snapped onto the female tapered connector body 2102 that allows the user to form a strong fluidic seal. The male connector 2103 also has tapered ports that mate to the corresponding taper grade of the female connector 2102 and create a tapered interference fit. The interference between the tapered ends helps complete a sound fluidic seal.

In another embodiment of a manually actuated docking station with an integrated connector, as shown in FIG. 21, the connector is comprised of a freely rotating screw ring 2101 snapped onto the connector body that allows the user to form a strong fluidic seal. The connector also has tapered ports that mate to the corresponding tapered item connector 2103 through an interference fit. The interference between the tapered ends helps complete a sound fluidic seal.

Figure 22:
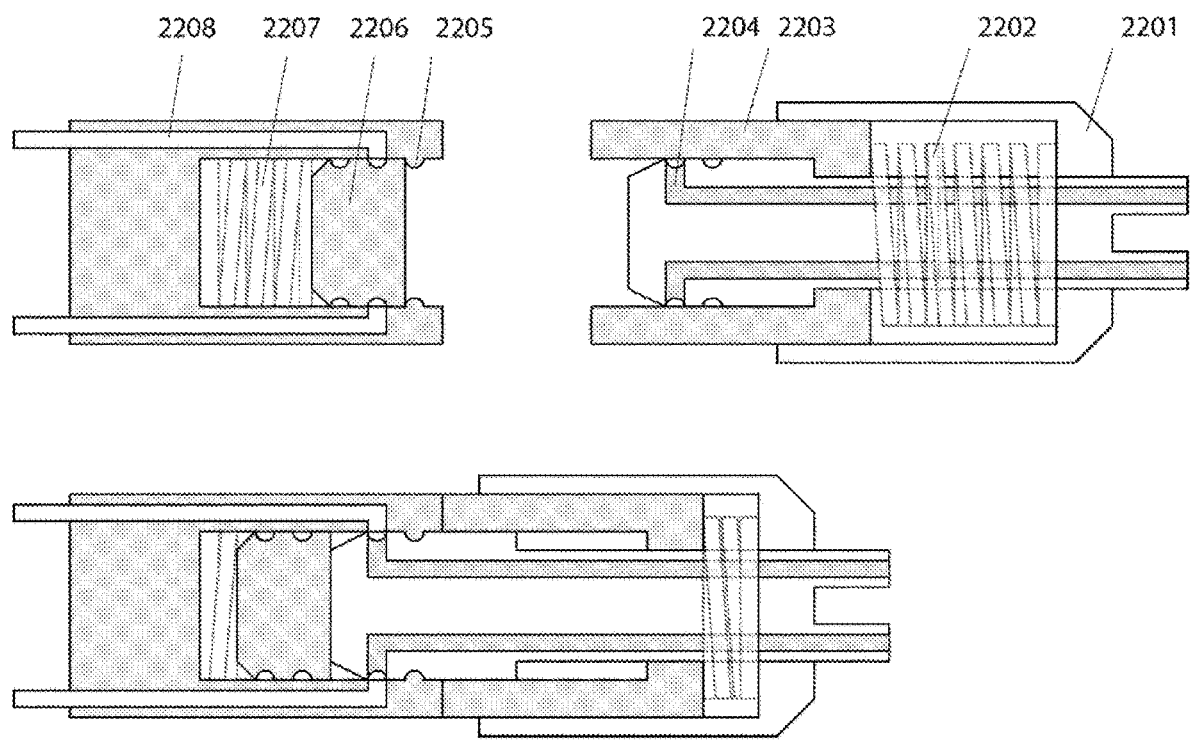
FIG. 22 is an example of a self sealing dry break connector with integrated microfluidic inlet and outlet fluid paths. In this embodiment, the male connector housing 2201 contains a spring 2202, or other force element, that pushes against a sealing ring 2203 that, when extended, closes off the fluid lines 2204 of the connector. The female counterpart has a screw thread 2205 that aligns the male connector, a sealing cap 2206 and associated spring 2207, or other force element, that when disconnected, shuts off flow in the female fluid lines 2208. A benefit of this design is the minimal dead volume resulting from the microfluidic lines being small enough to feed into the threading of the screw. Further, the spring, or other force element, loaded sealing cap 2206 provides a means to wipe clean the female fluid lines of dried fluid during connecting and disconnecting. This same self cleaning happens on the male side from screw thread 2205.

In yet another embodiment, there is a utility to provide for simultaneous connection of two fluid lines to simplify user interactions. FIG. 22 is an example of a self sealing dry break connector with integrated microfluidic inlet and outlet fluid paths. In this embodiment, the male connector housing 2201 contains a screw 2202 that pushes against a sealing ring 2203 that, when extended, closes off the fluid lines 2204 of the connector. The female counterpart has a screw thread 2205 that aligns the male connector, a sealing cap 2206 and associated screw 2207 that when disconnected, shuts off flow in the female fluid lines 2208. Unique to this design is the minimal dead volume resulting from the microfluidic lines being small enough to feed through the threading of the screw. Further, the spring, or other force element, loaded sealing cap 2206 provides a means to wipe clean the female fluid lines of dried fluid during connecting and disconnecting. This same self cleaning happens on the male side from screw thread 2205.

Figure 23:
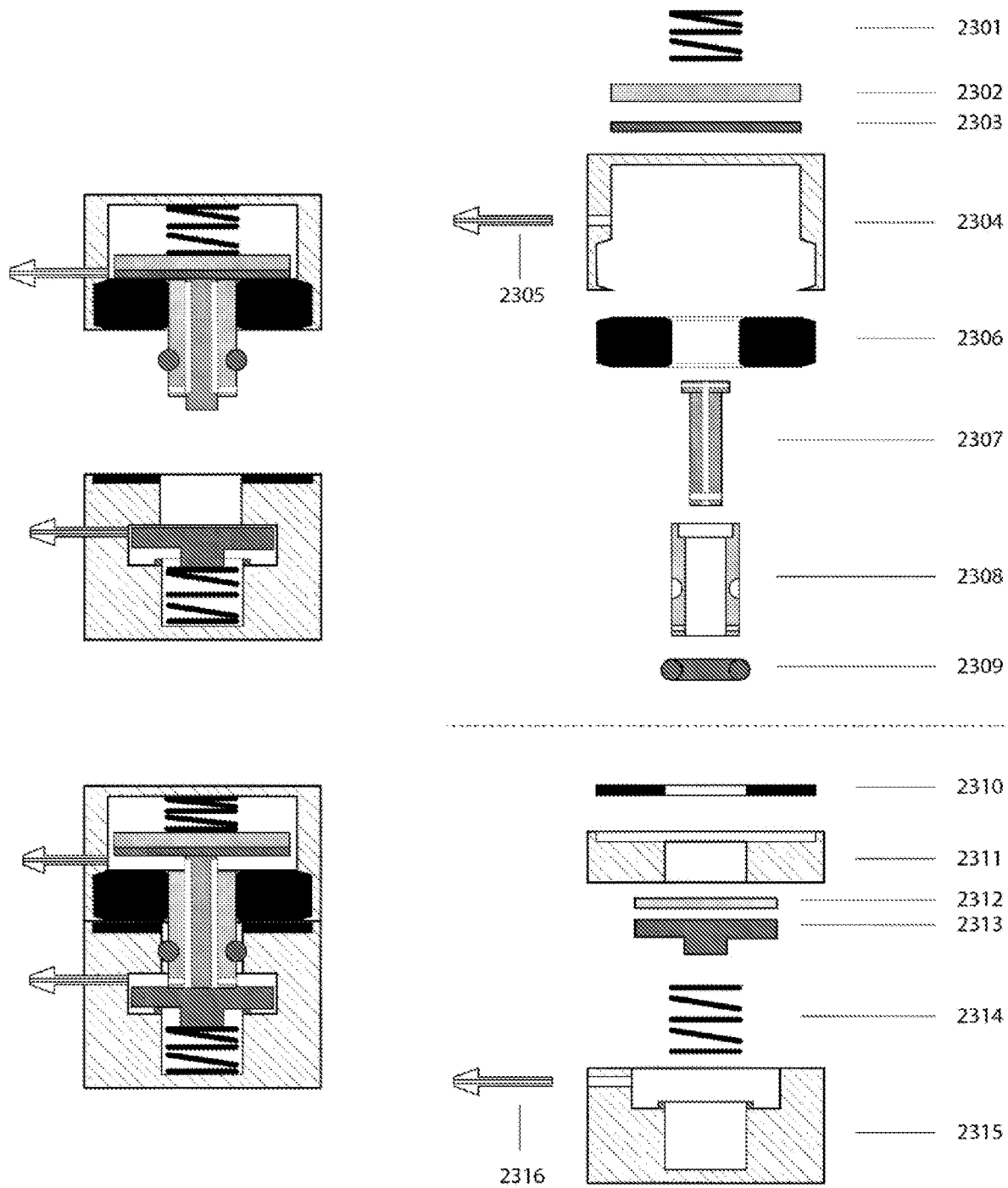
FIG. 23 is an example of magnetic connectors with integrated microfluidic inlet and outlet fluid paths. In this embodiment, a spring 2301, or other force element, upper cap 2302 and upper seal 2303 are housed within upper body element 2304. When disconnected, the spring 2301, or other force element, closes off the fluidic path 2305 by pressing the upper cap assembly up against the magnet 2306. An actuator pin 2307 with embedded fluidic channels passes through stud 2308, which is further coupled to an O-ring 2309 to provide for a firm fluidic seal when connected. In this embodiment, when placed in close proximity to the bottom half of the connector, the upper magnet 2306 couples with the steel (or other ferritic or magnetic material) 2310 embedded in the lower base 2311. This magnetic force simultaneously couples the upper and lower halves of the connector, and through action of the actuator pin, displaces lower seal 2312 and follower 2313 against spring 2314, or other force element, which are housed in the lower base 2315. This balance of forces opens the fluidic path 2316, and completes the fluidic circuit. In this embodiment, when disconnected, the springs (or bushings, pneumatic elements, etc.) press the seals back into place and create a dry break seal.

In other embodiments, the ease of connection is facilitated through magnetic forces. FIG. 23 embodies magnetic connectors with integrated microfluidic inlet and outlet fluid paths. In this embodiment, a spring 2301, upper cap 2302 and upper seal 2303 are housed within upper body element 2304. When disconnected, the spring 2301 closes off the fluidic path 2305 by pressing the upper cap assembly up against the magnet 2306. An actuator pin 2307 with embedded fluidic channels passes through stud 2308, which is further coupled to an O-ring 2309 to provide for a firm fluidic seal when connected. In some embodiments, when placed in close proximity to the bottom half of the connector, the upper magnet 2306 couples with the steel (or other ferritic or magnetic material) 2310 embedded in the lower base 2311. This magnetic force simultaneously couples the upper and lower halves of the connector, and through action of the actuator pin, displaces lower seal 2312 and follower 2313 against spring 2314, which are housed in the lower base 2315. This balance of forces opens the fluidic path 2316, and completes the fluidic circuit. In this embodiment, when disconnected, the springs (or bushings, pneumatic elements, etc.) press the seals back into place and create a dry break seal. In alternative embodiments, timing is added to the connector, wherein the actuator pin moves the valve into the open position while the connection is being made to avoid backpressure from the female side. In such an embodiment, shortly after the initiation of connection, the stud would seal the fluidic path via an O-ring, then pushes the female seal open.

Figure 24:
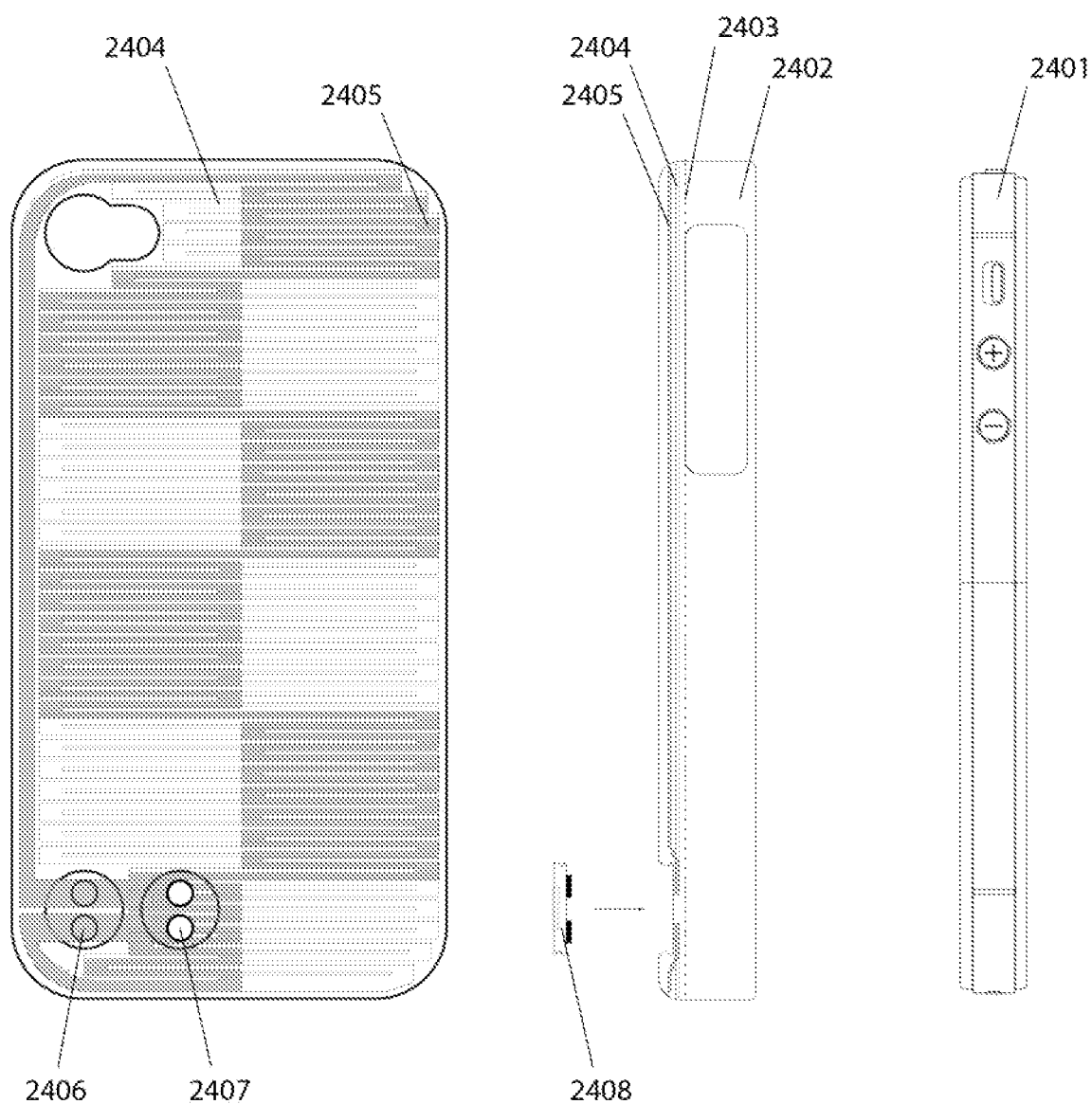
FIG. 24 is an example of multiple stacked circuits and multiple connectors within a single item. In this embodiment, two microfluidic circuits are embedded within the vertical extent of a mobile phone case. A mobile device 2401 is placed within case housing 2402 and pressed up against the case backing 2403. On the backside of the case, microfluidic circuits 2404 and 2405 combine to form a checkerboard pattern. When different colors are sequentially pulled through the circuit, the combination of colors produces a unique user defined case. In certain embodiments, there are separate connectors for each circuit, in this case, connector 2406 would allow access to microfluidic channel 2405 while connector 2407 would allow access to microfluidic circuit 2404. In addition, in this embodiment, each connector would be sealed when not in use by a thumb screw cap 2408.

In certain embodiments, a manually actuated docking station carries a plurality of fluid compartments to actuate flow within a plurality of microfluidic circuits, e.g., a two color cartridge could swap out the contents of two different microfluidic channel circuits simultaneously. In other embodiments, one connector per microfluidic circuit is arranged on the item, for example in FIG. 24, which gives an example of multiple stacked circuits and multiple connectors within a single item. In some embodiments, two microfluidic circuits are embedded within the vertical extent of a mobile phone case. A mobile device 2401 is placed within case housing 2402 and pressed up against the case backing 2403. On the backside of the case, microfluidic circuits 2404 and 2405 combine to form a checkerboard pattern. When different colors are sequentially pulled through the circuit, the combination of colors produces a unique user defined case. In certain embodiments, there are separate connectors for each circuit, in this case, connector 2406 would allow access to microfluidic channel 2405 while connector 2407 would allow access to microfluidic circuit 2404. In addition, in some embodiments, each connector would be sealed when not in use by a thumb screw cap 2408.

Online Distribution of Content Codes

Provided in certain embodiments herein is a system for providing the design to any design element described herein. In some embodiments, provided herein is a system for configuring the design of a design element comprising a microfluidic circuit, the system comprising a module configured to set a color sequence for filling the microfluidic circuit with one or more colored fluid. In various other embodiments, the system comprises any additional module suitable for providing a design, or a particular design to the design element. For example, in some embodiments, a system described herein comprises a module configured to set the flow rate or pressure of fluid filled into the microfluidic channel. Further, in certain embodiments, any system described herein further comprises a module configured to access a remote server comprising color sequence, flow rate, and/or pressure information for configuring the design of the design element; a module configured to detect the type of design element comprising the microfluidic circuit; one or more module configured to adjust the color sequence, flow rate of fluid, and/or pressure of fluid; or the like. Similarly, the system optionally comprises a module configured to achieve any of the processes or results described below.

In one embodiment, a Code is resolved by a central server to point to a reference file (HTML, XML, etc) that has all the information (the Code file format) that would include color patterns, fluid pressure filling instructions (timing, pressure, duty cycle, color sequence, fluid channel orientation), pictures used to augment your apparel, brands that you incorporate into the outfit, and meta-tags to define and classify the contents. Codes can be made malleable across different apparel through the use of progressive algorithms, i.e., given the apparel microfluidic channel map, the algorithm would describe one or more optimal filling patterns with the color sequence of choice. For instance, the user could be presented with a first, algorithmically optimized preview of the apparel. The user could then choose to modulate the color pattern using high level tools, such as applying filters to the apparel (rotating, horizontal stripes, vertical stripes, gradients, or other 2-D kernels). These Codes could be applied within a social network like Facebook, a PC or mobile platform app that allows people to share or modulate your latest Codes instantaneously (i.e., what I'm wearing to school today) and has a suggestion engine that can proffer different outfits based on the user's historical taste and recent self-expression. In one embodiment, suggestions could be updated with up-to-the minute crowdsourced data, and people can follow celebrities, designers, TV shows, etc., to get Codes for fashion.

Online Codesharing can tap into retail or online databases to suggest apparel combinations based on brand, local availability, online availability, complementary colors, etc. Retailers can purchase space on the Codestore to promote codes with their products. Codes can also be suggested based on hierarchical demographics, described by trends or styles (goth, sexy, preppie, classic, tasteful, etc.).

Codecasts, like podcasts, would allow people to download other designers' codes, follow celebrities, etc. The Code file format also allows users to purchase specialized codes for 99 cents.

In some embodiments, the system comprises any suitable processor, e.g., a central processing unit, or collection of processors comprising the modules described herein. In certain embodiments, provided herein is a sub-system comprising any one or more modules described herein that may be used in conjunction with any one or more other sub-system to achieve the results of the system described herein.

Certain embodiments of the present invention relate to the modulation of appearance or material properties within items such as apparel (e.g., footwear, shoes, belts, backpacks, hats, bracelets, wristbands, shirts, jewelry, glasses, materials for apparel, release papers, fibers, etc.), equipment (e.g., skateboards, rollerblades, snowboards, gloves, hockey pads, appliances, computers, electronics, gadgets, toys, etc.), and other three-dimensional objects (signs, corporate art, corporate logos, military vehicles, military gear, helmets, vehicle body panels, housewares, furniture, tabletops, walls, paintings, etc.). In some embodiments, provided herein is an item (e.g., an article of apparel, an article of sporting equipment, or the like) comprising a fluidic channel (e.g., a microfluidic channel containing therein a liquid, particularly a colored liquid). In specific embodiments, the fluidic channel is a part of a fluidic circuit that further comprises an inlet and an outlet, wherein the inlet and the outlet are connected by the fluidic channel. Moreover, some embodiments of the present invention relate to fluidic manipulation of appearance and/or material properties and modulation thereof, including a microfluidic circuit, inlets and outlets to the fluidic system, and a docking system to deliver fluid to the item.

Figure 1:
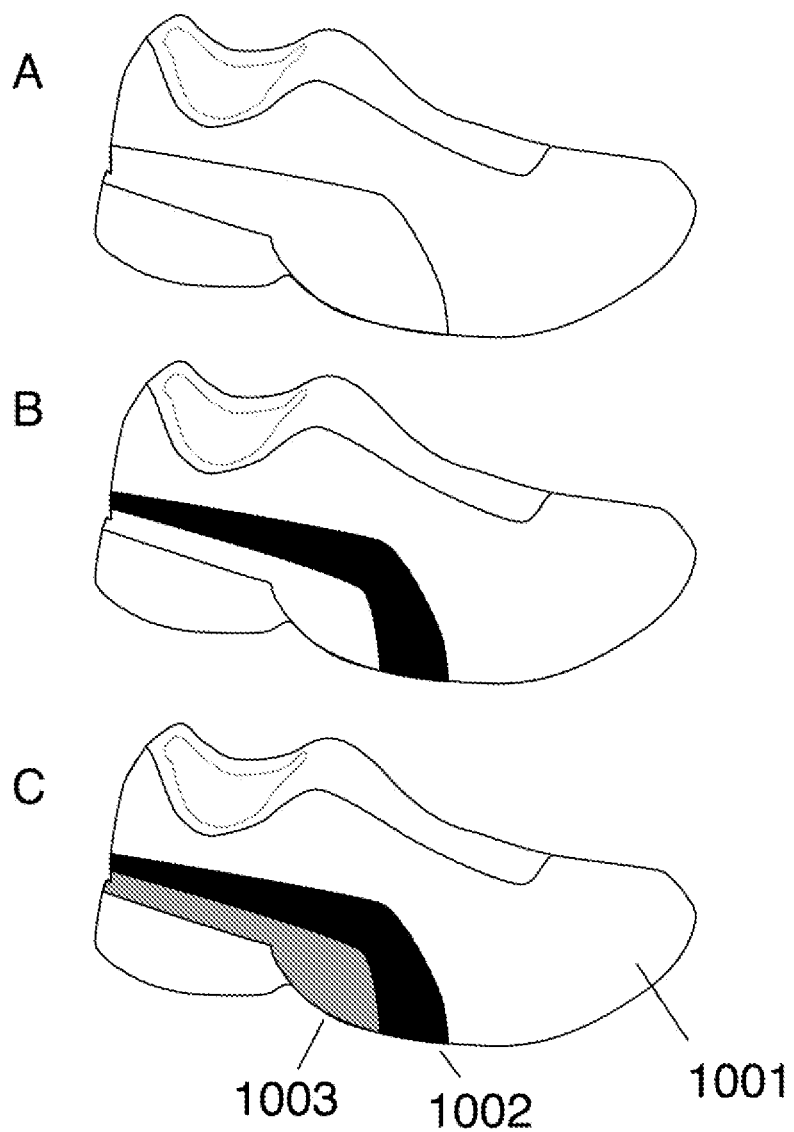
FIG. 1 is one preferred embodiment of the invention.
Figure 2:
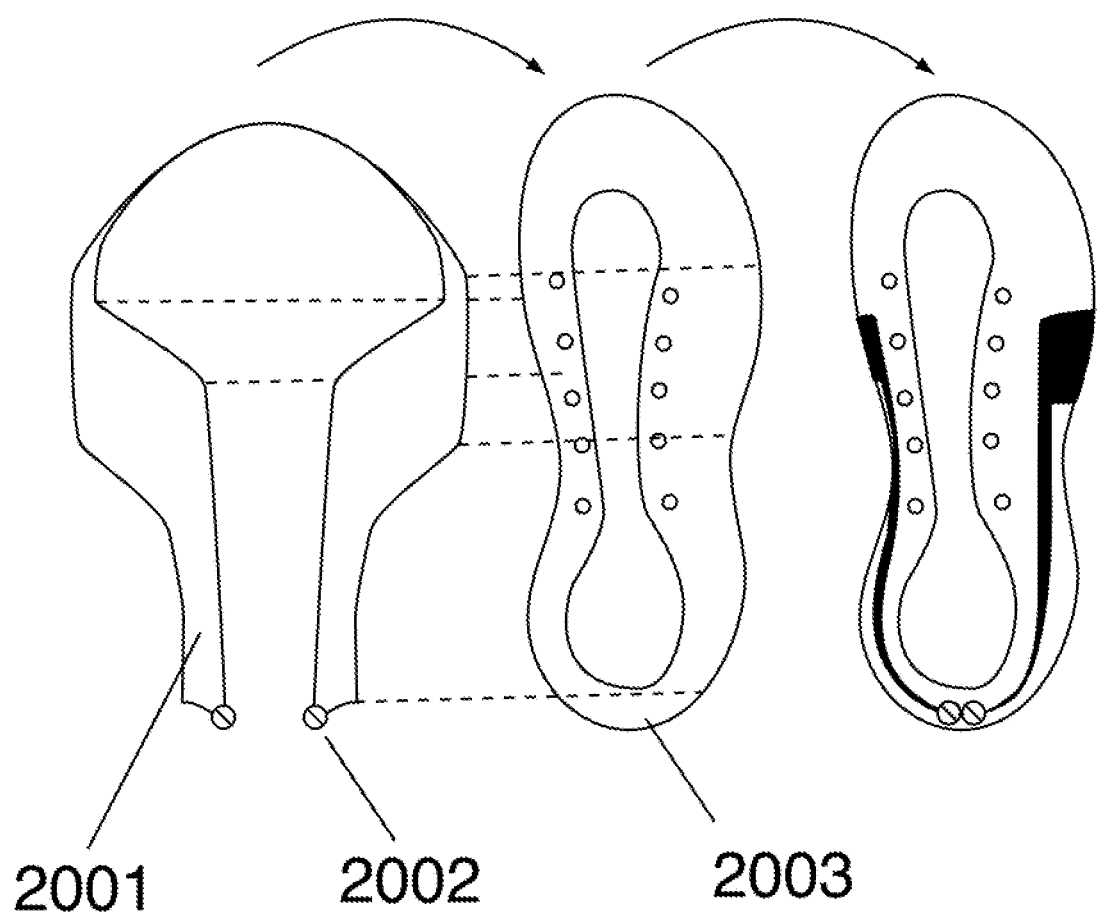
FIG. 2 shows one preferred embodiment of the construction of the shoe. The microfluidic circuit 2001 provides a fluidic path that wraps around the entire shoe. Valve 2002 allows access to the microfluidic circuit. When the microfluidic circuit is fastened to shoe 2003, the valves 2002 can be recessed within the back, heel, sole, or underside of the shoe to be inconspicuous. Moreover, partial extents of the microfluidic circuit can be hidden underneath successive layers of shoe 2003, to help shape the final design elements.
Figure 3:
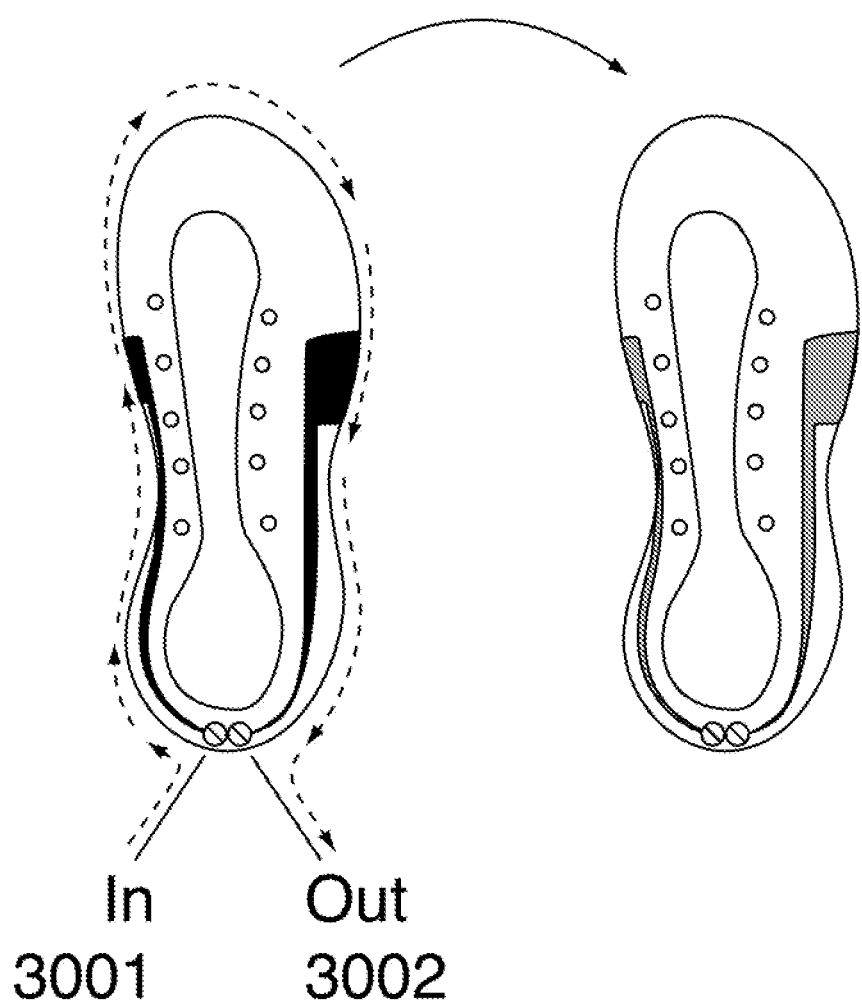
FIG. 3 shows one preferred embodiment of the microfluidic circuit in operation: changing from a dark color to a lighter color. When docked, the inlet valve 3001 and outlet valve 3002 allow lighter colored fluid to displace the darker colored fluid that previously filled the microfluidic circuit. Because certain extents of the circuit are hidden beneath successive layers of the shoe, the user may not see the color move around the toe of the shoe in this embodiment. Air or other spacer fluids can be pumped through the microfluidic circuit to segregate successive colors.

Certain embodiments herein provide an item comprising a microfluidic circuit to allow modulation of appearance or material properties of the item (FIG. 1). One or more microfluidic circuits in the shape of swooshes, stripes, ribbing along the outlines of a design, logos, background elements, etc. can be integrated into an item (FIG. 2). Microfluidic circuits may also encompass a large portion of the item, and in some cases substantially comprise the outer extent of the item; for instance in belts, skateboards, helmets, corporate logos, motorcycle panels, etc. In preferred embodiments provided herein, microfluidic circuits comprise an inlet, an outlet and a translucent or transparent microchannel (i.e., at least a portion of the microchannel is translucent and/or transparent) system, through which fluids can flow (FIG. 3). Microfluidic channel structures (including the fluidic channels and walls between channels) provided herein may cover up to 100%, up to 90%, up to 80%, up to 70%, up to 60%, up to 50%, up to 40%, up to 30%, up to 20%, up to 10%, or up to 5% of an item's surface. Microfluidic channel structures may cover 1-100%, 1-10%, 10-95%, 1-50%, 10-50%, 20-50%, 20-100%, 30-100%, or any other suitable amount of an item's surface.

Provided in certain embodiments herein a design article provided for herein comprises a microfluidic circuit integrated into or onto the surface thereof. In specific embodiments, the microfluidic circuit is integrated into or onto the external surface of the article. In certain embodiment integrated microfluidic circuits or molds comprising microfluidic circuits are attached to an underlying portion of the article surface (e.g., sewn thereto, glued thereto, etc.), or comprise a part of the surface itself (e.g., no underlying surface of the article is necessary). In some embodiments at least one segment (which term is used synonymously herein with a portion of the microfluidic circuit; and is not intended to necessarily denote any substructure of the microfluidic circuit) of the microfluidic circuit is exposed to the external surface of the apparel or equipment. Further, in some embodiments, the at least one transparent or translucent wall segment is exposed to the surface of the apparel or equipment, providing for visual contact between the surface of the apparel or equipment and the microfluidic channel (i.e., the fluid, or component parts thereof, can be seen from the exterior of the article). In certain embodiments, up to 100%, up to 90%, up to 80%, up to 70%, up to 60%, up to 50%, up to 40%, up to 30%, up to 20%, up to 10%, or up to 5%, 1-100%, 1-10%, 10-95%, 1-50%, 10-50%, 20-50%, 20-100%, 30-100%, or any other desired amount of the external surface or wall of the microfluidic circuit comprises a translucent or transparent material.

Provided in further embodiments herein is a method of manufacturing an article of apparel or equipment having alterable design features, the method comprising:
integrating a microfluidic circuit into or onto the surface of the article, the microfluidic circuit comprising a microfluidic channel, an inlet and an outlet, and the microfluidic channel having at least one segment in visual contact with an external surface of the article.

In some embodiments, provided herein is a method of modulating the appearance or material properties of an article of apparel or equipment comprising:
moving fluid through a microfluidic circuit integrated with the apparel or equipment and having at least one segment in visual contact with an external surface of the apparel or equipment, the microfluidic circuit comprising a microfluidic channel, an inlet and an outlet, with the microfluidic channel connecting the inlet to the outlet within the article.

In a first embodiment, one or a plurality of microfluidic circuit(s) are integrated into the exterior of an item of footwear. In one embodiment, the inlet and outlet of the microfluidic circuit are contained within a port hidden within the back heel of the shoe. In such an example, connection to the docking station allows the user to change the color of the exterior of the shoe to match the desired color. In certain embodiments, the microfluidic circuits are configured to cover 75% of the exterior of the shoe, for instance the channels can be integrated into the synthetic leather upper, the tongue of the shoe, and the sole. In other embodiments, the microfluidic circuits are configured to cover 25% of the exterior of the shoe, for instance against a white leather shoe, the microfluidic circuits comprise the stylized logos and decorative ribbing alongside the circumference of the shoe. In yet other embodiments, the micro fluidic circuits are configured to comprise 100% of the upper exterior of the shoe, having been integrated directly into the polyurethane or polyvinyl chloride release papers that then form the pad and the strap of a high heel shoe. In yet another embodiment, the microfluidic circuits are fashioned into 10% of the exterior of the shoe, molded to cover the straps on a pair of sandals. In another embodiment, the microfluidic circuits are integrated into the substructure of a shoe, covered by a porous material, such as a canvas or cotton to allow color to be seen through the gaps of the material. In yet other embodiments, combinations of microfluidic circuits offer multiple ways to expressing oneself, e.g., stiff polycarbonate microfluidic circuits prominently displayed on 50% of the exterior of the shoe with another 15% of the shoe covered in a soft polyurethane microfluidic circuit that covers the toe box and circumvents the shoelace holes. In certain embodiments, the microfluidic circuits are fabricated from polyurethane. In others, the microfluidic circuits are fabricated from polyvinyl chloride, poromerics, pleathers, Clarino, polycarbonate, or other synthetic leather materials.

In addition to the appearance of an item, the microfluidic circuit may also transport various fluids throughout the extent of the item to modulate the material properties of the item. For instance, in addition to the appearance, exchange of fluids within the microfluidic circuit may modulate the touch, feel, stiffness, or roughness of the item. In one embodiment, a metal microparticle sol may optionally displace an aqueous suspension of small molecule dyes to randomly distend a soft microfluidic circuit (for instance, made of lightly crosslinked polyurethane), which would simultaneously create raised reflective bumps along the skin of the item in place of the previous smooth, homogeneous and brightly colored surface. In another embodiment, a purple, heated, lavender scented polyethylene glycol solution with a large heat capacity is optionally pumped through the base of a shoe to displace a cold metal microparticle solution in order to modulate the thermal properties and rigidity of the shoe. In yet another embodiment, microfluidic circuits are molded into an article of clothing for a toy doll, in which a color (e.g., bright green) is optionally replaced by a magnetic glitter, that allows other magnetic components to be attached to the toy's apparel.

Other material properties that may be altered by transport through the micro fluidic circuit include optical properties (e.g., color, reflectivity, absorption), scent, thermal properties (e.g., heat capacity, heat transfer coefficient), mechanical properties (e.g., stiffness, roughness, pressure), electromagnetic properties (e.g., paramagnetic, ferromagnetic, conductive), therapeutic properties, or chemical properties (e.g., fluorescent, chemiluminescent) of the item.

Valves Between Connector & Item

In certain embodiments the openings (e.g., inlets to and/or outlets from) the microfluidic circuit contain valves. In such embodiments, input and output valves can be constructed from septum valves, check valves, ball valves, multi-port valves, microfluidic valves, pinch valves, and so forth. In one preferred embodiment, microfluidic circuit valves are comprised of a polyphenylenesulphone (PPSU), nitrile butadiene rubber (NBR), and polyimide (PI) passive dynamic check valve. In various embodiments, the valve may have any suitable dimension, e.g., roughly 2×0.5 mm in dimension. Further, in various embodiments, the valve may have any suitable structure and/or connection to the fluidic channel, e.g., be embedded within a stainless steel tube of roughly 2×17 mm with an internal volume of 2-5 nL. Valves used in the circuits described herein may deliver any suitable volume of fluid to the circuit. For example, in an embodiment, such as described above, a preferred valve may deliver 0.10-0.30 mL/s at a forward pressure of 7.25 psi. In certain embodiments, the normally closed valves are optionally coupled with a filter. In other embodiments, one or each valve is optionally a normally closed solenoid valve that is actuated by electrical signals carried by the connector to allow flow to various design elements on the item. In such an embodiment, one fluid line from the docking station is optionally split into a plurality of microfluidic circuits within the port of the item, and flow to each design element mediated by the aforementioned active valves.

Figure 4:
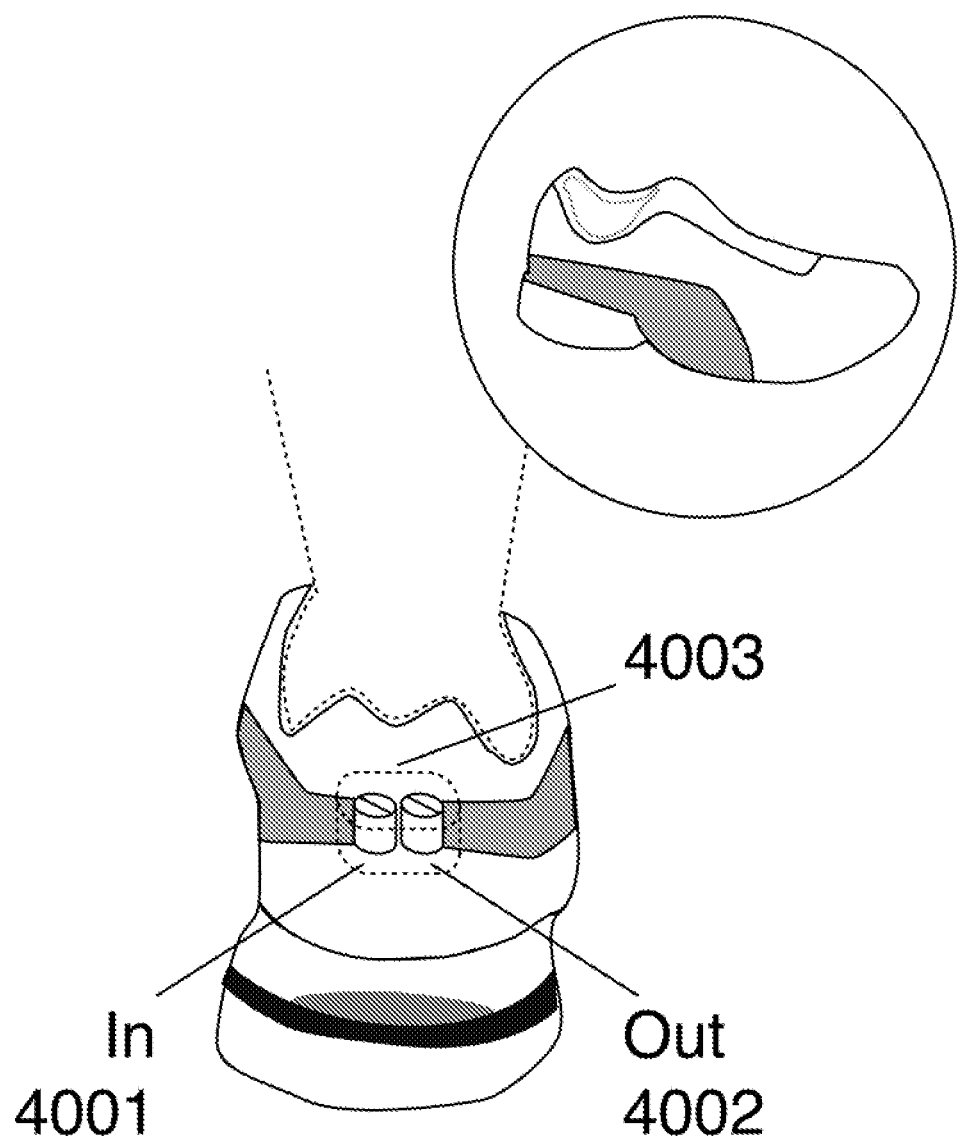
FIG. 4 shows an embodiment of the inlet valve 4001, and the outlet valve 4002 hidden within a recessed port 4003. The port 4003 serves to protect the valves from daily wear and assists in the mechanical coupling to the connector. The shoe in FIG. 4 contains a single microfluidic circuit.
Figure 5:
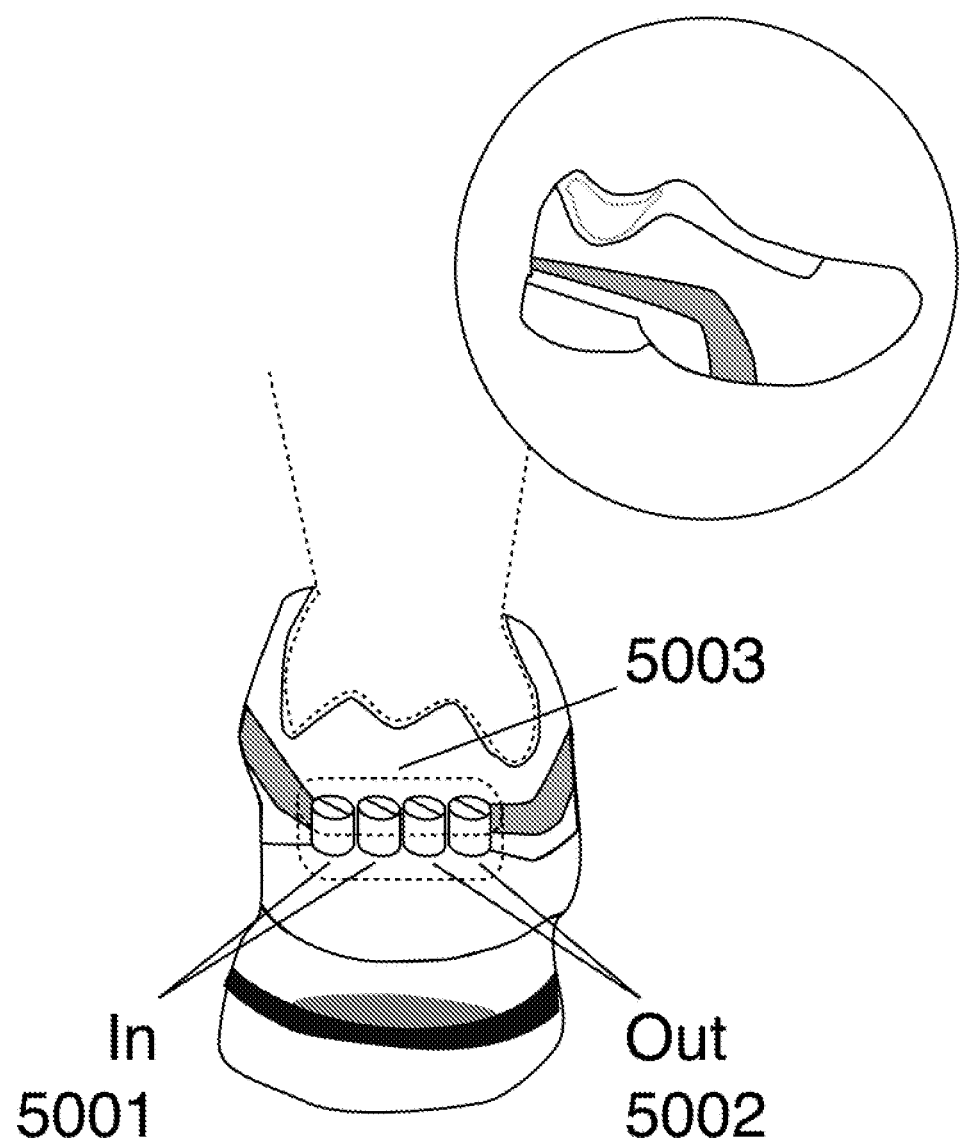
FIG. 5 shows a plurality of inlet valves 5001 and outlet valves 5002 hidden within a recessed port 5003. In this embodiment the shoe contains a plurality of microfluidic circuits to enable independent control of colors within specific extents of the item. In certain embodiments, a plurality of microfluidic circuits would converge at low pressure nodes to simplify connections to the item.
Figure 6:
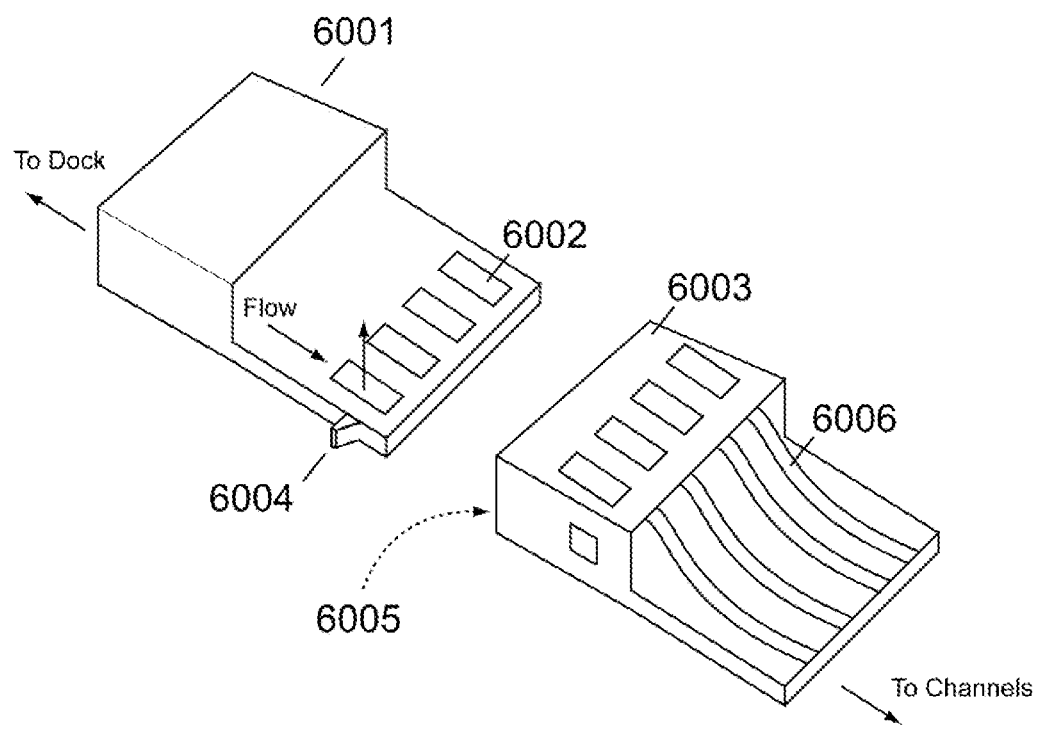
FIG. 6 shows an example of a connector 6001 structure with a plurality of inlets and outlets 6002 that are integrated into a single manifold. The connector slides into the port 6003. The two pieces snap into place via a male/female locking mechanism 6004. The mating of the connector to the port pushes back a spring-mounted seal 6005 that opens the circuit on the port side 6006. The seal also provides sufficient pressure on the connector to facilitate a leak-free fluidic connection between the channels on the two sides. The connector may have an additional seal on top of the manifold to assist in preventing leaks. The connector may also carry electrical signals to allow feedback upon connection.

In certain embodiments, the valves are optionally protected from wear by housing them in a port, e.g., a protective port, such as a hard plastic port (FIG. 4, FIG. 5). The port is optionally recessed within a shoe, for instance, hidden within a cutout of the sole, within the backing of the heel, or any other suitable location. The port can also be fabricated such that it facilitates simple insertion and alignment to the docking station connector, through molded guides, ramps, snaps, levers, male/female grooves, etc. FIG. 6 demonstrates an example of a connector that simultaneously interfaces to, and opens, the microfluidic circuit valves. In embodiments that use check valves, the increase in pressure from the docking station would open the valves in the item. Other embodiments that use simple septum valves would use a connector with pins that would push past the seal and enter the fluid lines in the item.

In certain embodiments, the valves are fluidically isolated on a parallel shunt channel or reservoir to prevent leaks while connecting and disconnecting. The shunt channel or reservoir may be separated from the primary microfluidic circuit by passive check valves to create a lower pressure fluidic region for the port connection. Following successful connector to port connection, upon application of fluid pressure the shunt channel opens to full fluid flow through to the microfluidic circuit.

Materials & Construction of Microfluidic Circuits

The microfluidic circuit of the items described herein (e.g., apparel) can be constructed of any suitable material. In certain embodiments, the structure of the microfluidic circuit or microfluidic channel comprises void (containing a fluid, or into which a fluid may flow) enclosed (e.g., with walls, with at least one opening) by any suitable material or combination of materials. In some embodiments, the microfluidic circuit or channel is constructed of (wholly or in part) a transparent plastic such as polyurethane, polyvinyl chloride, polymethylmethacrylate, cellulose acetate butyrate, polycarbonate, glycol modified polyethylene terephthalate, polydimethylsiloxane, as well as other transparent or translucent plastics suitable for apparel and/or sporting equipment. The microfluidic circuit can be comprised of a rigid, semi-rigid molded part, or in other embodiments, flexible molded parts. In one embodiment of a mold & seal process, two halves of the microfluidic circuit are injection molded and partially cross-linked, prior to alignment and sealing. Alignment of the two halves can be facilitated by the use of automated jigging that moves partially cured items from the molding machine into place, holds a top piece using vacuum pressure, then presses the two halves into one. In various embodiments, sealing comprises and/or is achieved via the use of pressure, heating, acid, UV light exposure, UV-ozone exposure, waiting to allow the partially cross-linked halves to bind to each other as polymerization reactions move towards completion, or the like. In other embodiments, sealing comprises application of an adhesive (chemical adhesive, multi-part epoxy, light-curable compounds, or soaking in acid etc.) between the two layers before applying pressure, heat, UV light exposure or time. Other methods of construction optionally include a process where a positive molding of a channel lumen is constructed using a soluble solid (either water soluble like sugars, starches, cellulose, etc., or soluble in an gentle organic solvent that will not perturb the two halves of the circuit), and is then placed in the polymer mold. In some of such embodiments, upon filling the mold and fully curing the circuit, the assembly is soaked in solvent to remove the channel lumen mold, or solvent is pumped through the circuit to dissolve the positive mold.

In some embodiments, a design feature or design mold comprises a plurality of microfluidic channels and/or microfluidic circuits. In certain embodiments, such a design feature or a design mold comprises a stitching or attachment portion for attachment to another design feature or design mold, or other material. In some instances, a stitching portion may include, e.g., a portion devoid of microfluidic channels, or of microfluidic channels that are sealed, or otherwise not connected or capable of being connected to a fluid source. In some instances, one or more microfluidic circuits may be molded such that a small outer rim of material is built into the circuit, such that the rim is sufficiently wide to allow stitching or adhesion onto the item's exterior. In various embodiments, the stitching or attachment portion, or rim, is of any size suitable for assembling an article described herein. For example, the rim would be preferably no more than 5 mm wide. In other embodiments, the rim would be on the order of 30 mm wide, which would be useful in cases where the outer rim of the microfluidic circuit is to be pulled over the last of a shoe during manufacturing. In other embodiments, design features, design molds, or other assemblies of microfluidic circuit(s) do not comprise and/or do not need such stitching/attachment portions or rims because they are attached in another suitable manner. For example, microfluidic circuits may also be attached to the item and/or fabricated into the item using an adhesive, epoxy, etc.

In other embodiments, the microfluidic circuit(s) (e.g., design mold) may be fashioned from a single layer of transparent plastic containing embedded channels sealed directly to the surface of the item, e.g., in the case of a skateboard or snowboard deck. In some embodiments, this type of construction is suitable for use in equipment where a thick layer of adhesive can be applied to the item and the channels pressed on top of the adhesive.

In other embodiments, the microfluidic channel/circuit construct (e.g., design mold) incorporates a backing material attached to a transparent/translucent material (e.g., plastic). In such embodiments, the backing material can be fastened to the item through an adhesives process or sewn to the item around the edges or at designated attachment points. In such embodiments, the backing material may supply additional optical characteristics such as a reflective surface (e.g., using biaxially-oriented polyethylene terephthalate), or an opaque white background (e.g., polyethylene).

In yet another embodiment, the surfaces comprising the lumen, exposed, or transparent portion of the fluidic channel/circuit construct are modified, treated, or coated to reduce adhesion to, adsorption from, or staining by the dyes used to modulate colors. These treatments and material selections include rendering the lumen hydrophilic for a hydrophobic dye, hydrophobic for hydrophilic dyes, charged for nonpolar dyes, as well as selecting the dyes and lumen to be both hydrophilic or hydrophobic. These treatments may also serve to reduce evaporation through the polymeric structure of the microfluidic circuit by laminating, coating, or otherwise sealing the exterior of the plastic.

In some instances, microfluidic circuit embodiments are intended to maximize reflected light to create the most vibrant color changing apparel and equipment, and in other instances, microfluidic circuit embodiments diffuse and distort light, including patterned surface textures made to specular light patterns consistent with the texture of leather, or prismatic embossments for adding sparkle to the surface, or a microlensed surface for a distorted effect. Other embodiments of microfluidic circuits incorporate the use of transmitted light from piezoelectric or battery driven LEDs. In other embodiments, the capability to modulate color is assisted through the use of an active element such as liquid crystals, nano-inks, e-inks, OLEDs, LEDs, or nanoparticle suspensions, etc.

Microfluidic Circuits

Fluidic circuits of the systems described herein comprise channels having any suitable dimensions, including, lengths, depths, diameters, geometries, etc. In various embodiments, the internal channels of the fluidic circuits are circular, square, oval, pyramidal, triangular, etc. In some embodiments, the internal diameters of the channels are any channel suitable to provide a desired design feature when filled with a liquid (e.g., a colored liquid). In specific embodiments, the internal diameter of a channel provided herein is small enough so as to minimize mixing and diffusion along the fluidic channel. In certain embodiments, the dimension (e.g., depth, width or diameter) of a fluidic or microfluidic channel described herein is at least 0.1 micron, of 0.1 micron to 10 mm, of 0.1 micron to 1 mm, of 0.1 micron to 100 mm, of 1 micron to 1 mm, of 1 micron to 500 micron, of 10 micron to 1 mm, of 10 micron to 0.5 mm, of 50 micron to 500 micron, or any other suitable diameter. Further, in various embodiments, different channel segments along a fluidic circuit may also possess varying dimensions (e.g., at one point along the fluidic circuit, the diameter may be 10 microns, whereas at other locations along the circuit, the diameter may be 20 microns, or the like).

Further, in various embodiments, the walls of the fluidic circuit (i.e., surrounding the fluidic channel) are of any suitable thickness. In some embodiments, the walls between microfluidic channels of a system described herein are narrower than the walls forming the surface and/or back constructs of the microfluidic channel. In some embodiments, wall widths between parallel channels of 1 micron to 10 mm, or 10 microns to 1 mm, 50 microns to 1 mm, 50 microns to 500 microns, 50 microns to 250 microns, 100 microns to 500 microns, 200 microns to 500 microns, 300 microns, 400 microns, or the like.

Figure 7:
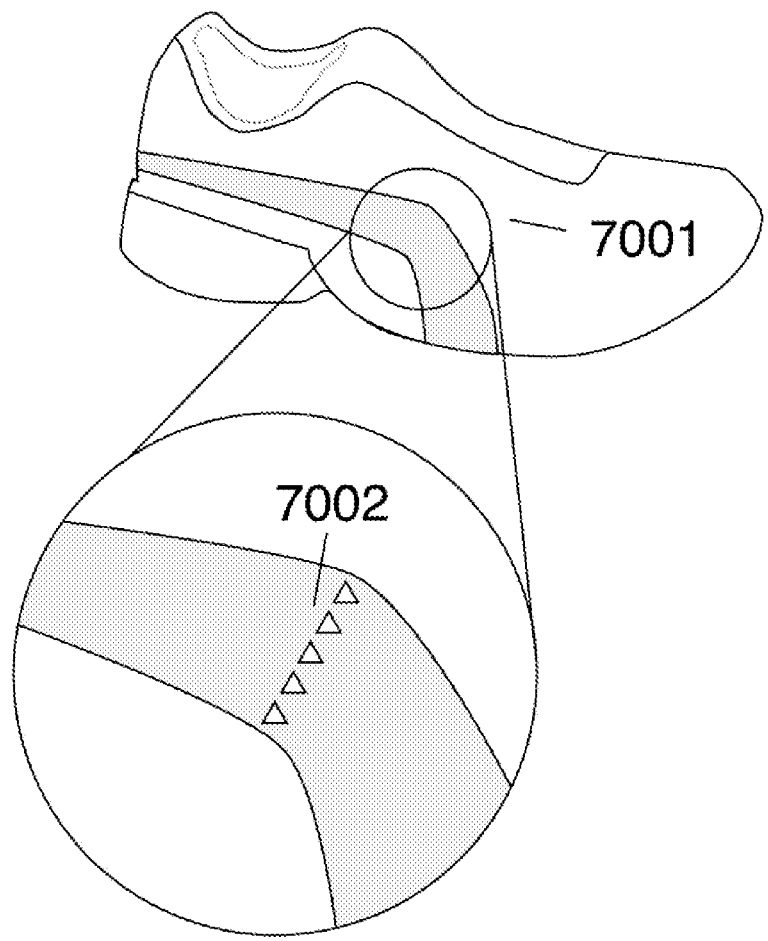
FIG. 7 shows an example of a microfluidic circuit 7001 with a mixer 7002 to facilitate homogeneous distribution of fluid within the microfluidic circuit.
Figure 8:
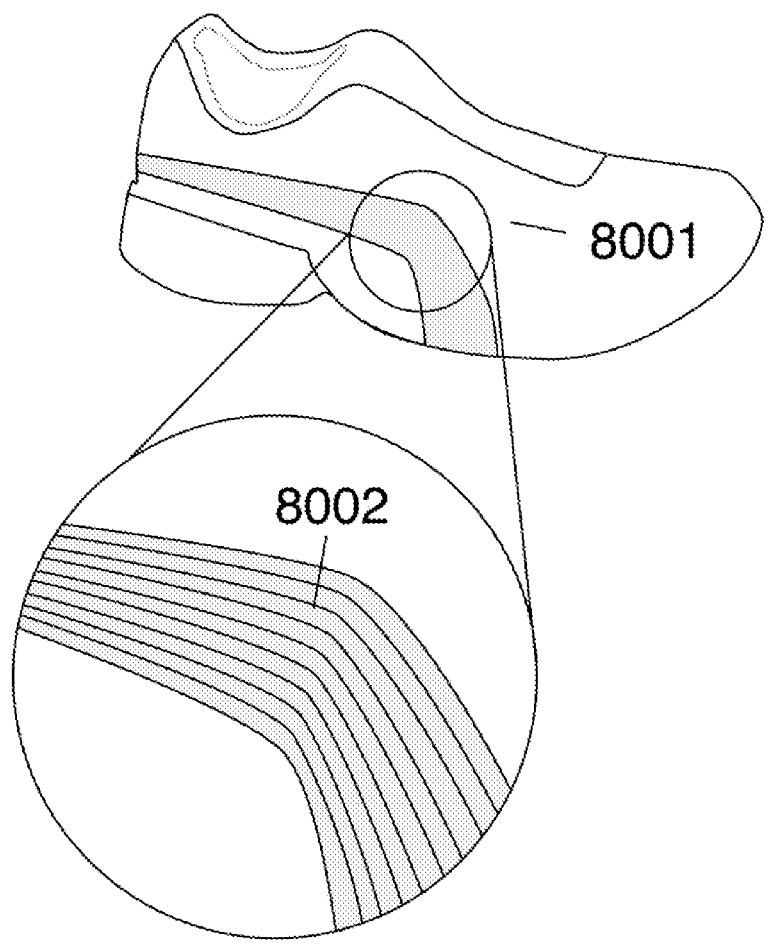
FIG. 8 shows an example of a microfluidic circuit 8001 consisting of a plurality of microfluidic channels. In certain embodiments, each channel could be constructed of a semi-circular cross-section to act as a lens. In certain embodiments, the flat underside of the microfluidic circuit closest to the shoe could contain a reflective layer to enhance the visible color. In certain embodiments, the microfluidic circuit is comprised of a single channel that fills the desired area.

The volume of the fluidic system would be preferentially minimized to drive the economics of the application while retaining sufficient color density to be aesthetically pleasing. In certain embodiments, this would translate into a very thin channel depth of the circuit, on the order of 10-1,000 µm. In other embodiments, the channel depth of the circuit would be on the order of 300-700 µm. In other embodiments, the vertical extent would be such that the Reynolds number would be much less than 2,300. In other embodiments, the fluidic channels are configured to promote plug flow, in order to eliminate boundary layers adjacent to the walls of the fluidic channel (Aris, Rutherford. *Vectors, Tensors, and the Basic Equations of Fluid Mechanics*. New York: Dover Publications, Inc., 1962; Panton, Ronald L. Incompressible Flow, Second Edition. New York: John Wiley & Sons, Inc. 1996, which are incorporated herein for such disclosure). In certain microfluidic embodiments, mechanical features of the design elements promote mixing, as dyes are pumped through the microfluidic circuit (FIG. 7), these include, e.g., any suitable microfluidic mixing mechanisms such as grooved channels, Tesla mixers, T- and Y-flow configurations, interdigital/bifurcation flow distribution structures, focusing structures for flow compression, repeated flow division- and recombination structures, flow obstacles, zigzag channels, and other passive micromixing designs or microvalving designs. In other embodiments, each microfluidic circuit comprises a plurality (one or more) of channels that carry an independent color or color series (FIG. 8). Examples of microfluidic circuit designs include shapes such as swooshes, bars, stripes, stars, toe pieces, shoelace holes, or even the majority of the outer face of a shoe. Microfluidic circuits can also comprise the entire outer extent of a three-dimensional item. For instance, the panels of a backpack, the outer section of a belt, the lettering within a corporate logo, the outer plastic shell of a rollerblade, or an identification panel on a military vehicle (that could communicate through a combination of infrared dyes or nanoparticles, for instance). Microfluidic circuits can also be made to be as simple as single tubes fashioned into as stripes on backpacks, hats, the rim of a shoe, or other apparel and equipment.

Figure 9:
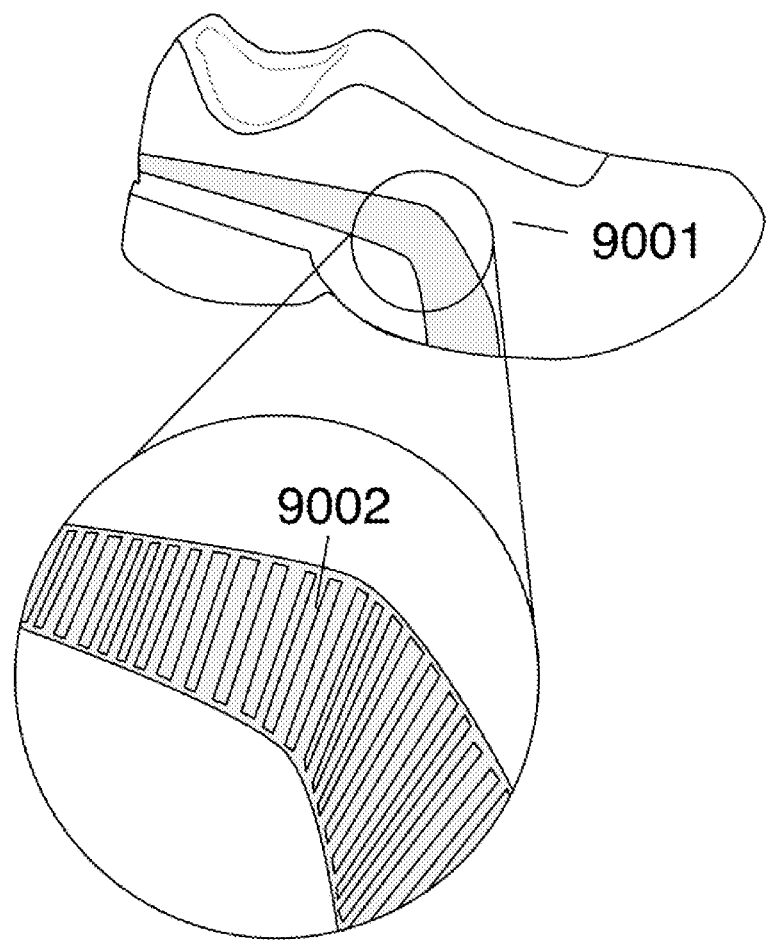
FIG. 9 shows an example of a microfluidic circuit 9001 with a single serpentine channel 9002. The serpentine channel widths would be roughly 0.35-1.05 mm, while the inter-channel (wall) spacing would be on the order of 0.40-0.45 mm.
Figure 10:
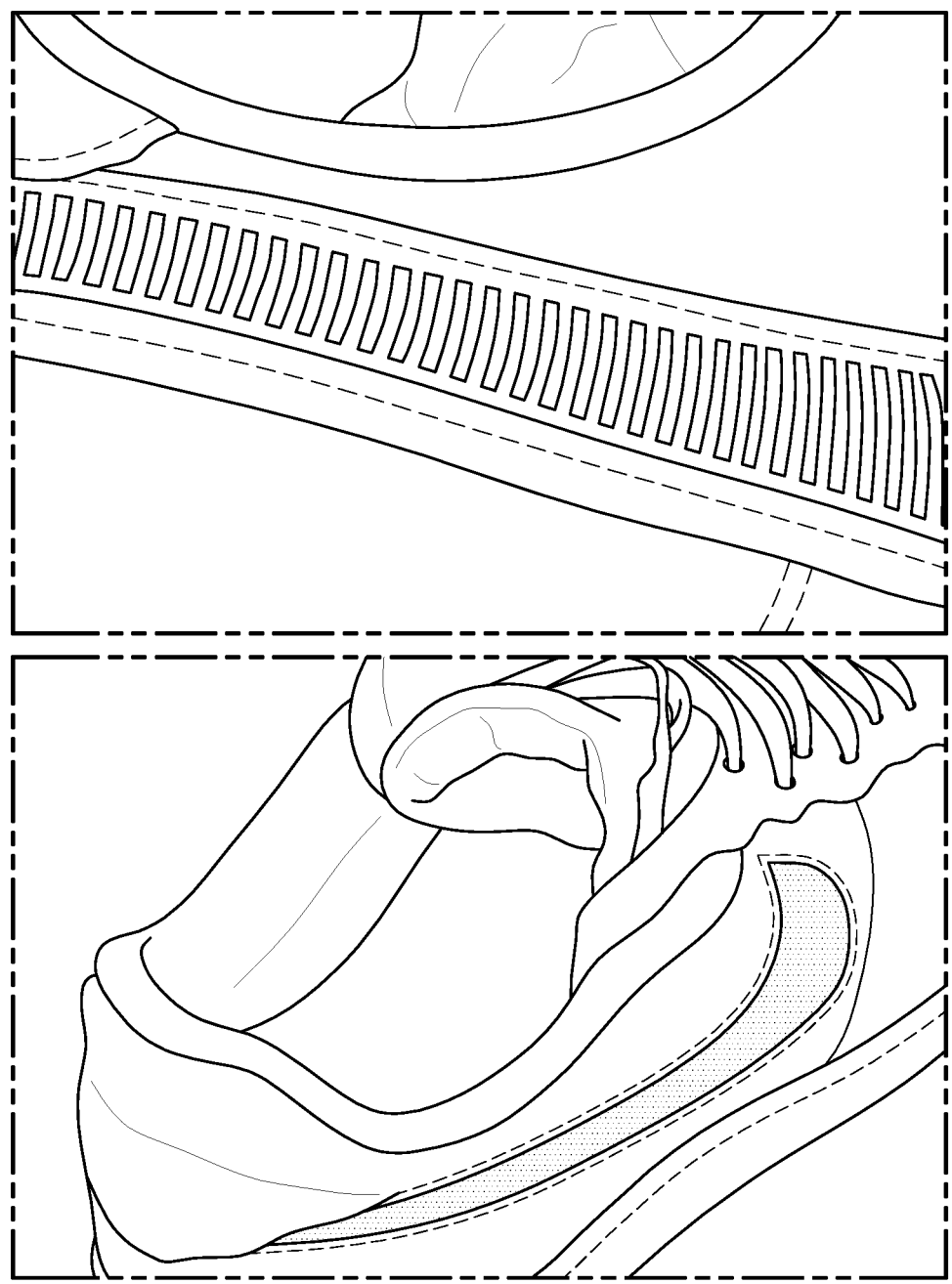
FIG. 10 shows a reduction to practice of a microfluidic circuit with a single serpentine channel integrated into a shoe. When viewed up close, individual turns of the serpentine channel are visible. When viewed from afar, the color of the microfluidic circuit appears continuous in this embodiment.

In a preferred embodiment, a single serpentine channel is woven throughout each design element to eliminate voids in higher pressure paths (FIG. 9). Optimal channel widths can vary between 0.05 mm-5 mm, with spacing between parallel channels of 0.05-1 mm (wall widths). In one exemplary embodiment, the channel wall width would is from 0.40 mm to 0.45 mm, while channel widths optionally vary between 0.35 mm and 1.05 mm depending on the portion of the serpentine path. In such an embodiment, with channel depths of approximately 0.5 mm and a total channel path length on the order of 2,500 mm, the a filling volume would be 500-600 µL (0.5-0.6 mL) and the filling time would be roughly 64 seconds at 3.2 PSI. In yet another exemplary embodiment, the minimum channel wall width would be 0.1 mm, with a maximum channel wall width of 0.65 mm, while channel widths would change between 0.35 mm and 1.25 mm depending on the portion of the serpentine path. In such an embodiment, with channel depths of approximately 0.5 mm, the total channel path length on the order to 2,000 mm, the filling volume would be 400-500 µL (0.4-0.5 mL) and the filling time roughly 15 seconds at 12 PSI. Larger channel cross sections, shorter path lengths and higher filling pressures would lead to shorter filling times. FIG. 10 demonstrates a reduction to practice of the serpentine channel concept on a shoe.

In other embodiments, a reflective, transmissive or transflective display is employed to provide beneficial, e.g., improved visual complexity of patterns. For instance, in bright lighting when non-reflective displays tend to show little color or no contrast, the display acts mainly as a reflective display. In some embodiments under low light conditions, when non-transmissive displays are not visible, a transmissive backlight is used. In one embodiment, the illumination characteristics of both transmissive and reflective modes are combined into transflective mode. In transflective mode, the display can modulate from reflective mode in bright lighting to transmissive mode in low lighting. In some embodiments, the transmissive mode display includes an illuminance sensor for control of the backlight in changing light conditions, and a transflecting layer capable of simultaneous reflection and transmission.

In some embodiments, visual brilliance and resolution of the display are enhanced through advanced modulation techniques. In addition to direct fluidic manipulation of properties, second-order control modalities can be used. These second-order control modalities include indirect fluidic manipulation; mechanical manipulation; passive and active electronic manipulation such as electrophoresis and electroosmosis; and magnetic manipulation.

In one embodiment, the fluid domain is partially or fully comprised of microcapsules containing ink. In some embodiments, the microcapsules containing ink are used in design articles or design elements instead of or in combination with the microfluidic channels described herein. Color appears to change based upon application of an external field causing external rotation of the microcapsule. As the microcapsule rotates, the ink domain that is visible changes. In another embodiment, color modulation is achieved by internal motion of dye by application of some external field to the microcapsule. In some embodiments, the applied field is the result of direct fluidic manipulation, or through one or a combination of a second-order control modality(s). In one embodiment, microparticle orientation is controlled electrophoretically by a passive electronic array embedded in within the fluidic circuit. In some instances, the microparticle has a plurality of different colored surfaces, e.g., such that upon change of the orientation thereof, a different colored surface is exposed to the surface of the article. The user can connect the color-changing piece of apparel to a computer or docking station, change the display via the embedded electronic array in the fluidic circuit, and disconnect from the docking station with a new pattern.

Docking Station Configurations

Figure 11:
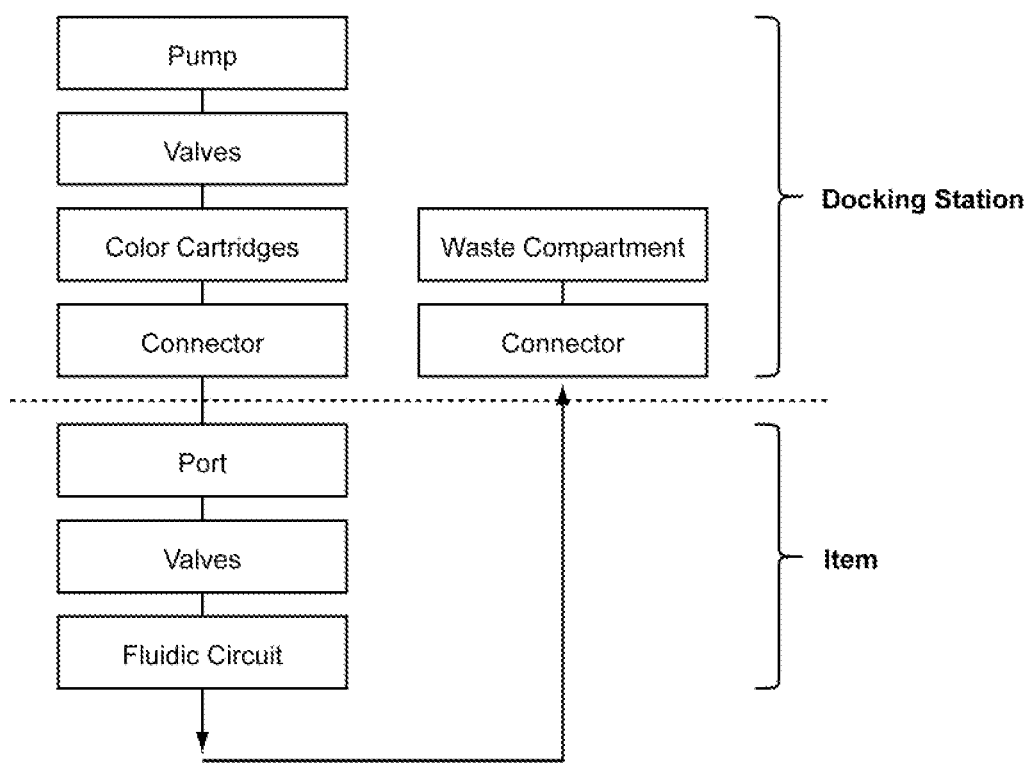
FIG. 11 is an example of an embodiment of the docking station, with a pump and a plurality of valves. In this configuration, the valves inside of the docking station change the resistance to flow of each line, in order to modulate the fluid that is pushed through the circuit. When connected, the pressure generated in the docking station opens the valves in the item, which allows fluid flow to progress throughout the extent of the item, returning into the docking station to be collected in the waste compartment. The waste compartment may contain an opening to air (e.g., to allow displacement), a bag, syringe plunger, hydrogels, or other compliant element or material element.
Figure 12:
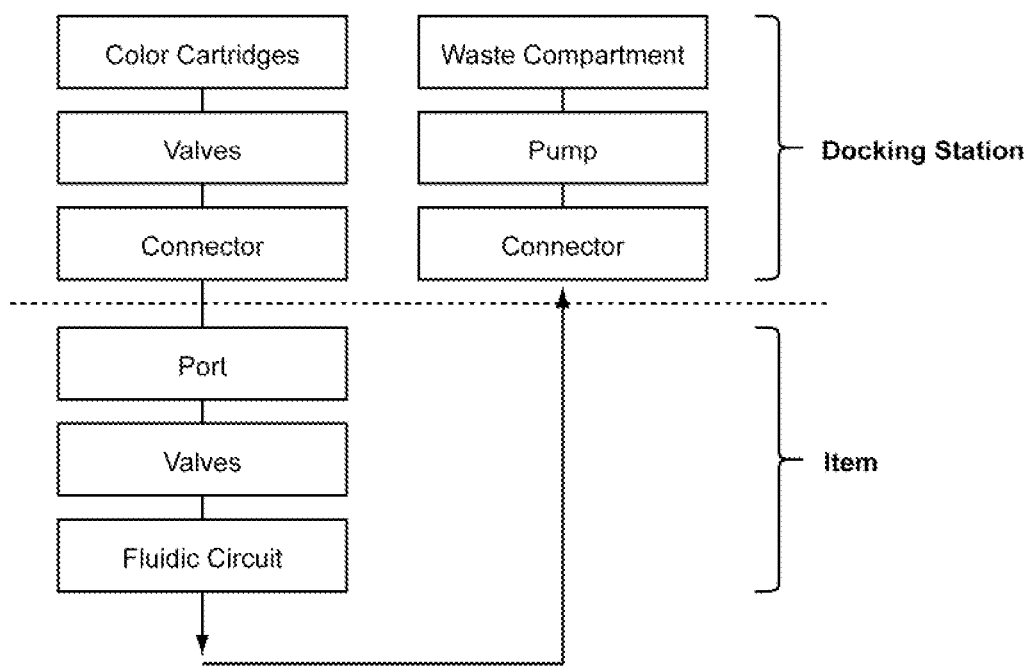
FIG. 12 is an example of a dock configuration with a pump that pulls the fluid through the circuit. Actuation valves change the resistance of the fluid lines to modulate the level of each type of fluid being pulled through the circuit.
Figure 13:
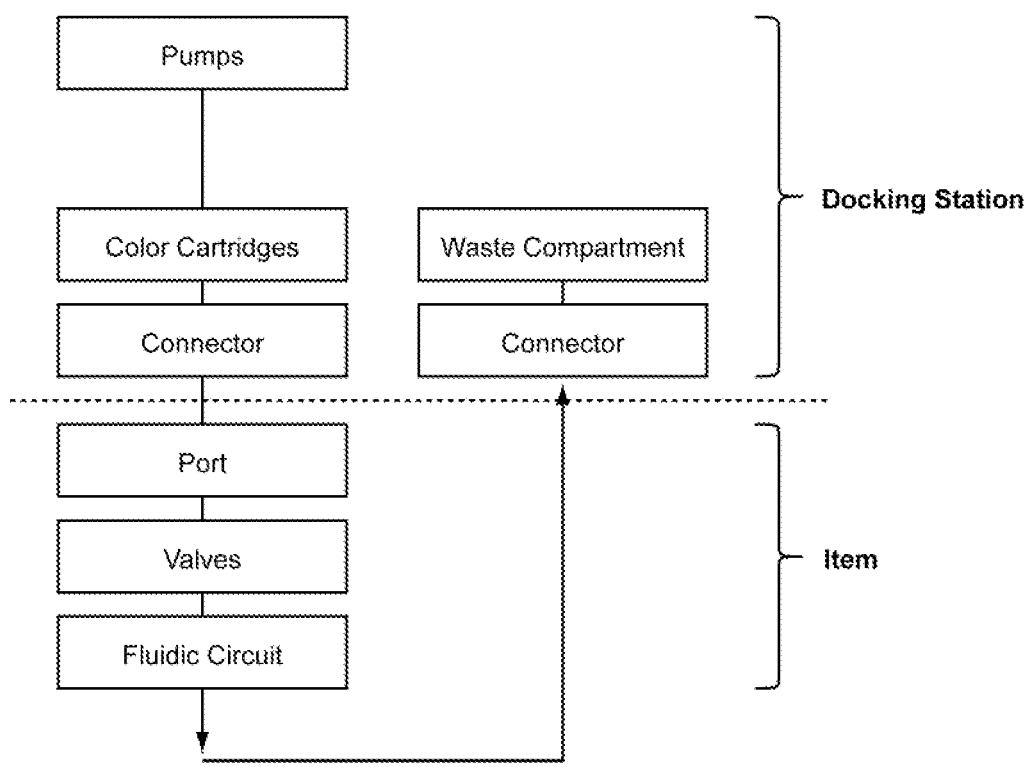
FIG. 13 is an example of a dock configuration with independent pumps on each of the fluid lines. No actuation valves are included. As in FIG. 12, another embodiment would place a negative pressure pump on the waste side. Such an embodiment would encompass manually actuated cartridge docking stations that do not carry a mixer element.

Within certain embodiments, a docking station (the dock) is used to optionally mix and ultimately distribute fluid into the item. In certain embodiments, the dock comprises a pump, actuation valve(s), color cartridge(s), a mixing element (a mixer), fluidic connector(s), a waste compartment, a combination thereof, or all of the above (FIG. 11, FIG. 12). In other embodiments each fluid channel carries its own pump (FIG. 13). Independently controlled pumps may obviate the need for actuation valves within the dock.

Mixer Designs within Docking Station

Figure 14:
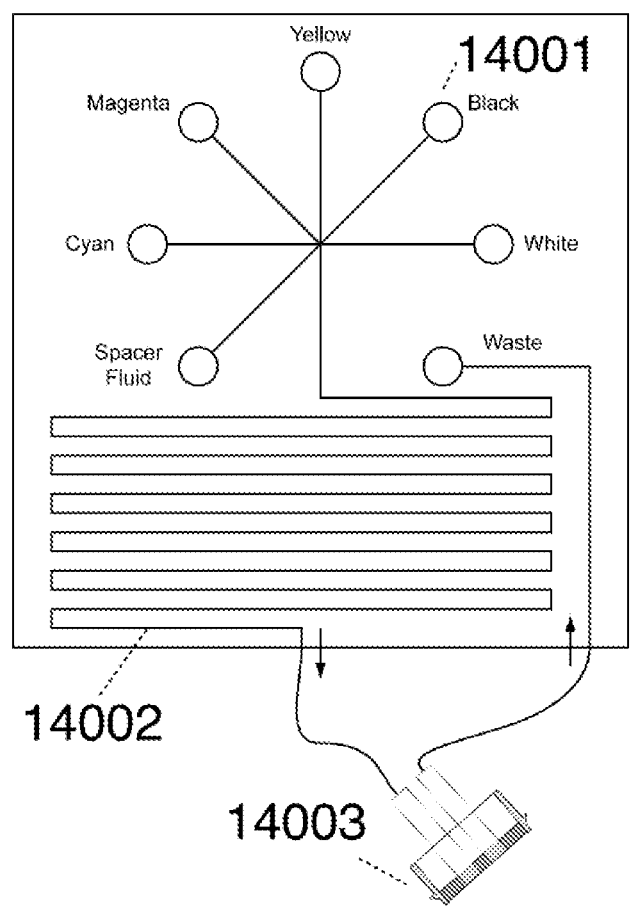
FIG. 14 is an example of a mixer configuration with a roughened channel, and input ports 14001 connected to the fluid cartridges (not shown). The roughened channel 14002 enables mixing. For instance, chaotic flow induced by herringbone grooves along the bottom of the channel would spatially compress mixing. Fluid exits the mixer into the connector 14003, flows through the microfluidic circuit, then returns through the connector into the waste compartment.
Figure 15:
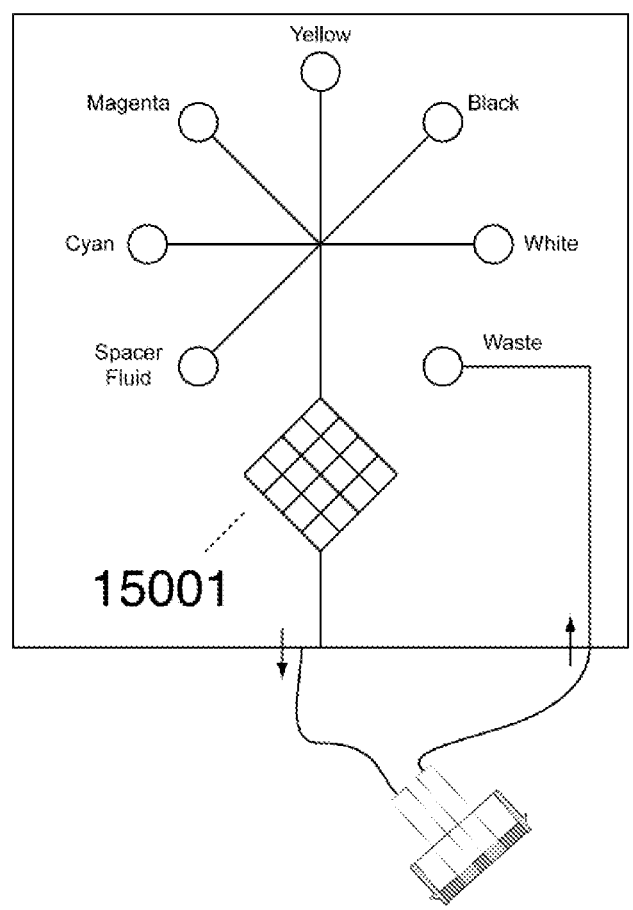
FIG. 15 is an example of another mixer configuration that takes advantage of flow splitting and recombination 15001 to promote mixing within a compressed path length.

Mixing of various fluids (e.g., different colors, such as primary colors) within the docking station can be achieved in any suitable manner including, e.g., the use of grooved channels, Tesla mixers, T- and Y-flow configurations, inter-digital/bifurcation flow distribution structures, repeated flow division- and recombination structures, flow obstacles, zig-zag channels, chaotic mixing, or other passive micromixing designs, flow splitting, hydrodynamic focusing, capillary flow splitting and recombination, flow twisting, chaotic advection, acoustic mixing, surface acoustic waves, heating, electromagnetic, magnetic, diffusion, or other active methods known to those skilled in the art of mixing within microfluidic channels. Examples of mixer designs are shown in FIG. 14 and FIG. 15.

Modulation of Fluid

Different levels of constituent fluids (i.e., cyan, magenta, yellow, black, white or clear color fluids, or alternatively red, green and blue fluids, or glittered, glow-in-the dark, fluorescent, and matte, or hot, cold, scented, therapeutic, magnetic, antiseptic, viscous, non-Newtonian fluids) can be mixed in different proportions to create a broad palette of colors, textures, therapeutic and other material properties. The different types of modulation can be broadly segregated into analog, digital, or temporal modalities.

In analog modulation, the amount of each fluid can be changed by varying the pressure on each line or by varying the resistance of each line given a single pressure. In the case where each fluid line is being forced by an independent pump, the pump pressure would be increased for more fluid, and lowered for less fluid. In such an embodiment, it may be useful to balance the overall pumping pressure to a relatively constant pressure that overcomes the forward valve pressure in the item, for instance the sum of all pressures could be kept the range of 3-12 psi.

In a second analog modulation method, a master pump is placed in the circuit while valves regulate the resistance on each line. The valves and pumps can be placed either before or after the fluid cartridges, and act upon the fluid lines, the fluid directly, or upon the airway to each cartridge. In one embodiment, each fluid line would contain a resistive valve that mediates the relative resistance through that line. In certain analog resistive modulation embodiments, indirect valves can be made to press on tubing with different amounts of force in order to compress the fluidic lines and increase resistance. Alternatively, indirect valves could constrict the flow of air to each fluid cartridge. In another analog embodiment, the fluid path passes directly through the resistive element of the valve. Analog systems would likely benefit from disposable tubing (such as in the case of indirect valves) to alleviate long-term plasticity on the fluid level calibration. Valves may be actuated by diaphragm, a screw being driven by a stepper motor, or by a solenoid valve, for example.

In a first digital embodiment, each fluid cartridge is connected to a plurality of valves, each of which is binary in nature, providing either flow or no flow, e.g. a solenoid valve. When a greater proportion of a single fluid is desired, a greater number of the binary valves are opened. Such an embodiment allows a well-defined palette and easily calibrated fluid choices. For instance, if each cartridge had four valves, each of which was driven by its own solenoid, and there were four colors of fluid (CMYK), a palette of 4^4=256 colors could be created.

Figure 16:
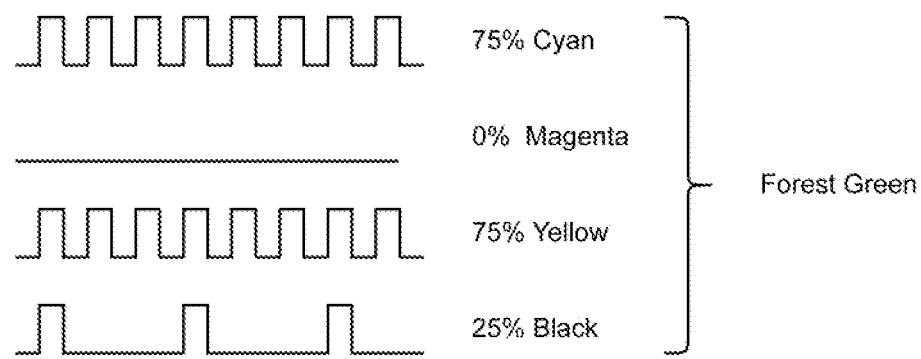
FIG. 16 gives an example of a time series of valve actuations in a temporal modulation paradigm.
Figure 16:
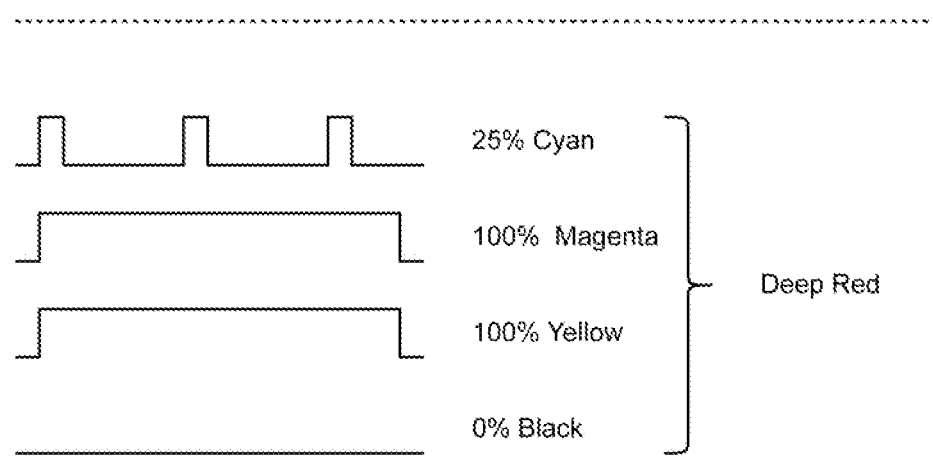

Temporal modulation relies upon binary flow from each cartridge to be controlled through valves (or independent pumps). In this embodiment, valves are pulsed open or closed according to a schedule of relative duty cycles. Solenoid valves (one per fluid channel) would be particularly well suited for this approach. As fluids recombine through a microfluidic mixer, the output flow would be a reflection of the integral of duty cycle frequency and mixer path length. Shorter path lengths and faster modulation times would result in a higher resolution switching between fluid packets. An example of duty cycle scheduling is shown in FIG. 16.

Provided in certain embodiments herein are microfluidic mixer chips comprising one or more microvalves. In some embodiments, provided herein is a docking station comprising a microfluidic mixer chip. In specific embodiments, the microfluidic chip comprises an array of microvalves. In some embodiments, the microfluidic chip comprises metal film atop (e.g., thin metal film spun atop) one or more elastomeric membrane. In certain embodiments, one or more regions of metal film are positioned atop the elastomeric membrane, thereby forming the array of microvalves. In some embodiments, provided herein is a system comprising a microfluidic chip described herein and at least one microsolenoid for actuating the one or more microvalve thereof.

In some embodiments, in order to create a digital array of microvalves within a microfluidic mixer chip that are electronically addressable, a thin film metal (magnetic, paramagnetic, or conductive) is spun atop an elastomeric membrane. In some embodiments, a microfluidic valve fashioned to be in normally closed position, closed by the elastomeric membrane, is actuated using current fed to an inductive coil located directly beneath the coated membrane. In other embodiments, the valve works in reverse phase, where normally open valve is pulled close using the electromagnetic field. These valves may also be mechanically actuated using a microsolenoid to drive a piston into and out of the flow path of the chip. The elastomeric membrane may also be constructed out of a polymer (e.g., PDMS, PE) with iron micro/nanoparticles embedded within material to enable actuation via microcoil.

Replacing Fluid within Microfluidic Circuits

There are several methods of replacing fluid within the micro fluidic circuits and the fluids of a circuit described herein may be removed and inserted in any suitable manner. For instance, electrophoretic, electroosmotic, dielectrophoretic, electrothermal flow, electromagnetic, or other electromotive flow types; or pressure based flow (including piezoelectric, diaphragm, peristaltic, positive displacement, rotary pumps, manually operated bellows pumps and so forth). In one preferred embodiment, a 6 mL/minute piezoelectric diaphragm pump, with external dimensions of roughly 30×15×4 mm is placed on each fluidic channel. In another embodiment, a 2-roller peristaltic pump is placed after the outflow of the item to pull fluid through the microfluidic circuit, in which case independent valves would be used to modulate the level of each fluid flowing through the circuit.

In another embodiment, pre-mixed cartridges containing a single fluid and a connector to deliver fluid to the circuit. In such embodiments, the cartridges may be pre-pressurized and contain a valve that opens when connected to the item. Alternatively the user may use a bellows, syringe or a bulb attached to one end of the cartridge to manually pump the fluid through the item.

Replacing the fluid within microfluidic circuits is optionally achieved by replacing the resident fluids within the microfluidic circuit without flushing the circuit. In one embodiment, a bolus of air or immiscible fluid may precede the novel fluid to prevent mixing with the resident fluid. Alternatively, gradients of appearance or material properties can be created by continuously changing the constituent levels of fluid introduced into the circuit without introducing a bolus of immiscible fluid. An immiscible fluid utilized in certain embodiments herein may comprise a fluid with sufficient density to substantially alter its flow profile throughout the microfluidic circuit.

In one embodiment, the entire volume of the microfluidic circuit is filled with a single color fluid, or fluid with identical material properties. In yet other embodiments, microfluidic circuits can be filled with a series of fluid packets (volumes of fluid less than the entire circuit volume) to produce multiply colored or striped elements. In yet another embodiment, sequential aliquots of very small volume can be serially moved down the microfluidic circuit to create an image.

Compositions of Fluid

Fluids utilized in the circuits, items, or systems described herein include any suitable or desirable fluid. In specific embodiments, the fluid is a gel or a liquid (e.g., a solution, a suspension, a colloid, an emulsion, etc.). In some embodiments, liquids provided for herein are colored liquids. In further or alternative embodiments, liquids provided for herein comprise a suspended material, such as metallic particles, magnetic particles, reflective particles, or the like.

Colored fluids may be comprised of small molecules such as ethyl-[4-[[4-[ethyl-[(3-sulfophenyl)methyl]amino]phenyl]-(4-hydroxy-2-sulfophenyl)methylidene]-1-cyclohexa-2,5-dienylidene]-[(3-sulfophenyl)methyl], disodium 6-hydroxy-5-((2-methoxy-5-methyl-4-sulfophenyl)azo)-2-naphthalene-sulfonate, or 2,2'-Bis(2,3-dihydro-3-oxoindolyliden). Fluids may also be comprised of particle suspensions or polymer solutions. In certain embodiments, particles can be fashioned from polymeric nanoparticles, preferentially 50-200 nm in diameter with covalently bound (or absorbed) dye molecules, or in some configurations up to 20-50 μm. For instance, PMMA or polyethylene particles at a density of 0.99-1.01 g/cc can be used for optimal suspension in water. Bichromal, translucent, opaque, fluorescent, iridescent, opalescent, magnetic, gold, silver, drug-delivery, long-release, infrared or highly reflective particles can be used to impart additional qualities to the item. Small molecule dyes or pigments may also be bound to extended chain polymers (i.e., polyethylene glycol, PMMA etc.) and suspended in a solvent to mitigate staining of the fluidic channels. Fluids may be comprised of a small molecules, a functionalized polymer, nanoparticles, microparticles, or combinations therein.

In certain embodiments, optical properties can be altered by using a fluid comprised of dyes, pigments, polymeric dyes, nano- or microparticles with color molecules covalently attached, adsorbed, mixed, or otherwise attached. In other embodiments, scent can be altered by using a fluid comprised of small organic compounds, volatile aromatic compounds, perfumes, etc. In other embodiments, thermal properties can be altered by using a fluid comprised of boron nitride, aluminum, copper particles to increase the heat transfer coefficient, ceramics, metal particles, or other polymers. In other embodiments, mechanical properties can be altered by using a fluid comprised of high viscosity liquids such as higher concentrations of polyethylene glycol to control stiffness of the equipment of apparel. In other embodiments thixotropic, shear thickening, shear thinning, or other non-Newtonian fluids can be added to modulate the modulus of elasticity of the apparel or equipment. In other embodiments, mechanical properties can be altered by using a fluid comprised of large microparticles to distend the microfluidic circuit to add texture to apparel or equipment.

In other embodiments, electromagnetic properties can be altered by using a fluid comprised of iron particles to increase the Chi of the apparel or equipment. In other embodiments, therapeutic properties can be altered by using a fluid comprised of pharmaceutical compounds such as non-steroidal anti-inflammatory compounds, corticosteroids, local anesthetics such as lidocaine, vasodilator, vasoconstrictor, or antiseptics. In such embodiments, the porosity or permeability of the microfluidic circuit may be enhanced by interactions with the apparel or equipment, e.g., walking on a therapeutic shoe, body heat in a therapeutic vest, flexing a therapeutic wristband.

Cartridges & Dye Materials

Cartridges used in any system described herein may take any suitable form. In one embodiment, a cartridge provided for herein comprises a plastic container that contains either dry and/or wet color materials. In certain embodiments where the cartridges contain fluid, the cartridges could be sealed on top with a compliant plastic bag that would expand into the void of the cartridge as the colored fluid is pumped out of the cartridge. Cartridges can be connected to the mixing manifold by luer locks, tubes, septum valves, etc. Prior to insertion into the dock, the cartridges could be sealed by a tab or a valve. If shipped with dessicated ink, the cartridges could be open to the air, and the dock could push fluid through them to reconstitute and deliver the color. In certain embodiments, fluidic cartridges contain a waste compartment to receive fluid from the outlet of the microfluidic circuit.

Docking Station Sensors

In order to accommodate microfluidic circuits of different volumes, e.g., in the case of different sized shoes, the docking station may include sensors substantially configured to measure fluid properties of the micro fluidic circuit. Such sensors can be incorporated within the extent of the docking station or alternatively within the connector to observe the flow at the inlet or outlet. In certain embodiments where a homogeneous fluid is required throughout the circuit, fluid flows until the color at the outlet matches the color at the inlet within a desired tolerance. In other embodiments, fluid flows until the color at the outlet matches the preselected color to a desired tolerance. Incorporation of a sensor network within the docking station allows the fluid transfer interface to be guided by a control system (PID, PI, negative feedback, and so forth) to regulate pressures within operable limits. In certain pumps, such as serial piezoelectric pumps, sensors can be integrated into the pump head to facilitate pressure balancing. The dock may include a variety of types of sensors, including flow sensors, pressure sensors, and optical sensors. Within embodiments containing optical sensors, the dock may further comprise a light source to illuminate the dye within the microfluidic circuit to enable facilitate optical sensing; for instance, through the use of a plurality of light emitting diodes, filaments, or fluorescent sources. The dock may also be comprised of ultrasonic or acoustic sensors to detect flow.

One preferred method of active feedback to indicate to the dock when start and stop flow is to incorporate a "start codon" or a "stop codon" of fluid and or air so that a very clear signal is sent to the docking station upon reaching the end of the previous fluid pattern. These codons can be comprised of a high frequency pattern of air and color, for instance five air pulses and five black pulses in a row. In such an embodiment, codons would precede or follow every fluid injection cycle, and would be easily recognizable during sensing.

User Interfaces

In certain embodiments, the user interface can be running on a computer or phone connected to the docking station (through USB, 802.11 wireless, bluetooth, infrared, internet, etc.) wherein the interface allows the user to control the color of individual compartments of the item. Color selections can be made through an on-screen color wheel, eye-dropper tool to sample a color from a picture, or through a mobile application that allows image sampling and subsequent selection of color preferences. In certain embodiments, the user manually selects a color (or image, or portion of an image) from an image uploaded to the screen via camera, phone, internet, etc. Color parameters can also be downloaded and shared through a network that allows social networking with friends to coordinate item colors for that day. Color parameters can be selected automatically through crowdsourcing, data mining, pushed from central servers, and so forth. In one embodiment, basketball teams can coordinate shoe colors for home and away games through a social network. In another embodiment, marketing efforts can distribute codes to correspond to select color palettes on certain days. In yet another embodiment, complimentary color combinations are applied across a broad variety of items, such as shoes, backpacks, hats and belts. In other embodiments, the user preferences may extend to material properties other than color.

In other embodiments, the dock would not contain a mixing element and the choices in the user interface would be constrained to the current panel of colors within the dock. For instance, a single color cartridge could be swapped out of the dock at a time. In this embodiment, the interface could be appropriately simplified, using a manual pump (e.g., a syringe) to initiate pumping of fluid. Flow could also be automatically initiated upon connecting the item to the single colored dock (e.g., through a vacuum chamber).

Communication of preferred volume and pressure parameters between the item and docking station can be facilitated by an EEPROM or RFID tag within the apparel or equipment. Such a communication paradigm would allow parameters of the equipment or apparel to be sent to the dock, for instance, volume of the fluidic channel, number and location of valves, type of fluidic channel, preferential pressure algorithms, item identification, or any other data that would facilitate efficient modulation of appearance or material properties. In yet other embodiments, the user would enter a code representing the pertinent details of item.

Figure 17:
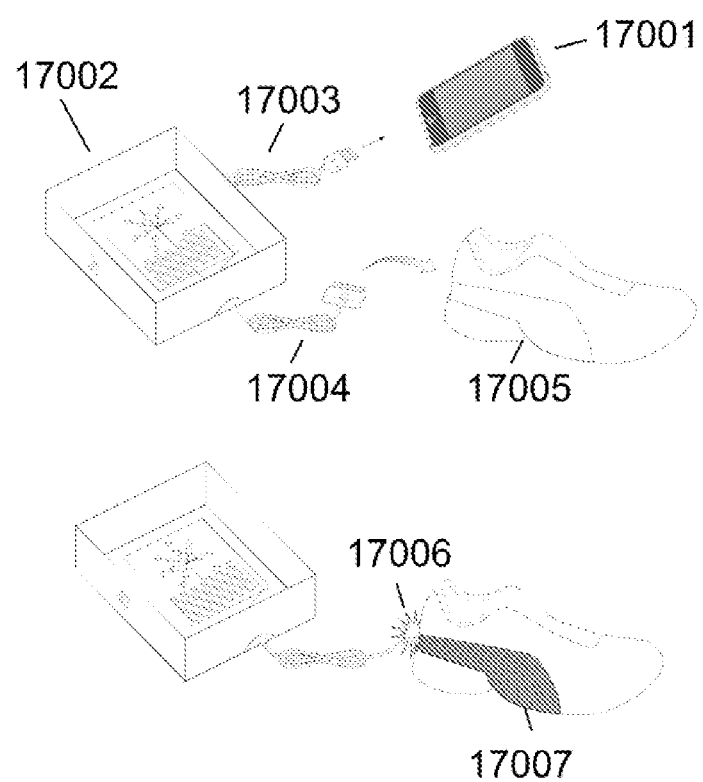
FIG. 17 gives an example of a workflow for changing the color of an item. The user would connect a computer 17001 (or iPhone, in the example) to the docking station through USB connector 17003. The user attaches the fluidic connector 17004 to the port of the shoe 17005. Upon connection, the connector illuminates to provide feedback to the user that the connection has been made 17006. Using the graphical user interface on the computer 17001, the user selects the extent of the item they would like to change 17007, then command the docking station to deliver the appropriate color. The dock can be configured to fill one or more items at a time. In the case of shoes, the dock can be configured to fill two shoes at once.

Once the item has been identified, the user interface software can query a central server to retrieve essential valving, volume and pressure parameters. Codes could also be used to retrieve relevant metadata that enhances a user experience. The metadata could include three-dimensional models of the item, social networking enhanced profiles of friends or users of similar items. Metadata could also be comprised of shared parameter sets (i.e., color combinations, appearance, or other material properties) derived from friends, celebrities, sports figures, authorities (coaches, athletic directors, marketing directors, art directors, etc.), or promotional materials (television giveaways, soda caps, etc.). Metadata could also be made to be malleable across apparel and equipment; for instance, color schemes for multiple design elements within shoes, logos on hats, and ribbing within sporting equipment could be coordinated through the hierarchical assignment of valve priorities (where each item would have a primary valve set, secondary valve set, etc., and the color programs would be coordinated between items). An example of the workflow is shown in FIG. 17.

What is claimed is:

1. A process for preparing a design element or design article, the process comprising:
   providing a first thermoplastic material that is configured in a microfluidic channel network, wherein the microfluidic channel network comprises an inlet and an outlet, and wherein the microfluidic channel network comprises a channel having at least one dimension less than 1 mm;
   laminating a second thermoplastic material onto the first thermoplastic material; and
   attaching a valveless connector to the inlet and the outlet, wherein the connector is configured to be releasably coupled to an external fluid source and provide negative pressure at the outlet via manual actuation thereby allowing fluid to flow into the inlet from the external fluid source.

2. The process of claim 1, wherein the first thermoplastic material is of a harder or softer durometer than the second thermoplastic material.

3. The process of claim 1, wherein the second thermoplastic material is laminated onto the first thermoplastic material using heat and/or pressure.

4. The process of claim 1, wherein the connector is overmolded to the microfluidic channel network.

5. The process of claim 1, wherein the inlet and the outlet are co-located.

6. The process of claim 1, wherein the inlet and the outlet are co-located near an edge of the first thermoplastic material.

7. The process of claim 1, further comprising attaching a backing material to the first thermoplastic material.

8. The process of claim 7, wherein the backing material is reflective.

9. The process of claim 1, wherein the second thermoplastic material is translucent.

10. The process of claim 1, wherein the second thermoplastic material is transparent.

11. The process of claim 1, wherein the microfluidic channel network comprises a serpentine network.

12. The process of claim 1, wherein laminating the second thermoplastic material onto the first thermoplastic material comprises applying pressure using a roller.

13. The process of claim 1, wherein the first thermoplastic material is configured as a sheet and the second thermoplastic material is configured as a sheet.

14. The process of claim 1, wherein the microfluidic channel network is stamped into the first thermoplastic material.

15. The process of claim 1, further comprising flowing a colored fluid through the inlet into the microfluidic channel network, wherein the colored fluid is visible within the design element or design article.

16. The method of claim 1, wherein the microfluidic channel network is substantially rigid.

17. The method of claim 1, wherein the channel has at least one dimension less than 500 microns.

18. A method comprising:
   providing a first thermoplastic sheet comprising a serpentine microfluidic channel formed on a first side of the first thermoplastic sheet, wherein the serpentine microfluidic channel is fluidly coupled to an inlet and an outlet near an edge of the first thermoplastic sheet, wherein the microfluidic channel comprises at least one dimension less than 1 mm;
   attaching a second thermoplastic sheet to the first side of the first thermoplastic sheet such that the serpentine microfluidic channel is enclosed; and
   attaching a valveless connector to the inlet and the outlet, wherein the connector is configured to be releasably coupled to an external fluid source and provide negative pressure at the outlet via manual actuation thereby allowing fluid to flow into the inlet from the external fluid source.

19. The method of claim 18, further comprising applying an overmold to the first thermoplastic sheet and the second thermoplastic sheet.

20. The method of claim 18, wherein attaching the second thermoplastic sheet comprises applying heat and/or pressure.

* * * * *